(12) United States Patent
Naohara et al.

(10) Patent No.: US 12,211,197 B2
(45) Date of Patent: Jan. 28, 2025

(54) SUBSTRATE PROCESSING APPARATUS AND SUBSTRATE PROCESSING METHOD

(71) Applicant: SCREEN Holdings Co., Ltd., Kyoto (JP)

(72) Inventors: Hideji Naohara, Kyoto (JP); Hiroaki Kakuma, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 761 days.

(21) Appl. No.: 17/289,771

(22) PCT Filed: Oct. 25, 2019

(86) PCT No.: PCT/JP2019/041866
§ 371 (c)(1),
(2) Date: Apr. 29, 2021

(87) PCT Pub. No.: WO2020/090643
PCT Pub. Date: May 7, 2020

(65) Prior Publication Data
US 2021/0398260 A1 Dec. 23, 2021

(30) Foreign Application Priority Data
Nov. 2, 2018 (JP) .................................. 2018-207318

(51) Int. Cl.
*G06T 7/00* (2017.01)
*H01L 21/67* (2006.01)

(52) U.S. Cl.
CPC .......... *G06T 7/001* (2013.01); *H01L 21/6715* (2013.01); *H01L 21/67253* (2013.01);
(Continued)

(58) Field of Classification Search
CPC .......... G06T 7/001; G06T 2207/10024; G06T 2207/10152; G06T 2207/30148;
(Continued)

(56) References Cited

U.S. PATENT DOCUMENTS 8,587,743 B2 11/2013 Takafuji
2008/0243296 A1 10/2008 Asai et al.
(Continued)

FOREIGN PATENT DOCUMENTS

CN 107764193 A 3/2018
JP 2004-226328 A 8/2004
(Continued)

OTHER PUBLICATIONS

Notice of Final Rejection dated Mar. 14, 2023 in corresponding Korean Patent Application No. 10-2021-7013138 and computer generated English translation obtained from the JPO.
(Continued)

*Primary Examiner* — Marcos L Torres
(74) *Attorney, Agent, or Firm* — OSTROLENK FABER LLP

(57) ABSTRACT

A substrate processing apparatus processes a substrate. The substrate processing apparatus includes at least one processing unit that processes the substrate, first and second cameras that image different subject areas, and an association processing unit that generates association information indicating association between each of the subject areas and each of the first and second cameras by processing an image captured by each of the first and second cameras.

15 Claims, 12 Drawing Sheets

(52) U.S. Cl.
CPC .............. *G06T 2207/10024* (2013.01); *G06T 2207/10152* (2013.01); *G06T 2207/30148* (2013.01)

(58) Field of Classification Search
CPC ..... G06T 7/292; H05B 47/155; H01L 21/027; H01L 21/304; H01L 21/67051; H01L 21/6715; H01L 21/67253; H01L 21/00; B05C 11/08; B05C 11/10; G06V 10/141
See application file for complete search history.

(56) References Cited

U.S. PATENT DOCUMENTS

| | | |
|---|---|---|
| 2010/0234969 A1 | 9/2010 | Inoue |
| 2011/0169893 A1* | 7/2011 | Takafuji ................... B41J 3/407 347/49 |
| 2015/0039116 A1 | 2/2015 | Yamamoto |
| 2015/0262848 A1 | 9/2015 | Sano et al. |
| 2018/0053319 A1 | 2/2018 | Kakuma et al. |
| 2018/0323085 A1 | 11/2018 | Sano et al. |

FOREIGN PATENT DOCUMENTS

| | | |
|---|---|---|
| JP | 2007-114842 A | 5/2007 |
| JP | 2010-050223 A | 3/2010 |
| JP | 2013-214279 A | 10/2013 |
| JP | 5556661 B2 | 7/2014 |
| JP | 2015-173148 A | 10/2015 |
| KR | 10-2008-0090281 A | 10/2008 |
| KR | 10-2010-0022996 A | 3/2010 |
| KR | 10-2014-0117608 A | 10/2014 |
| KR | 10-2015-0106368 A | 9/2015 |
| KR | 20170048784 A | 5/2017 |
| WO | WO 2010/032615 A1 | 3/2010 |
| WO | WO-2012124521 A1 * | 9/2012 ........... G01N 21/896 |

OTHER PUBLICATIONS

Request for the Submission of an Opinion dated Aug. 30, 2022 in corresponding Korean Patent Application No. 10-2021-7013138 and machine language English translation obtained from the Global Dossier.

Notice of Reasons for Refusal dated May 24, 2022 in corresponding Japanese Patent Application No. 2018-207318 and a computer generated English translation obtained from the JPO.

International Search Report mailed Nov. 26, 2019 in corresponding PCT International Application No. PCT/JP2019/041866.

Written Opinion mailed Nov. 26, 2019 in corresponding PCT International Application No. PCT/JP2019/041866.

Office Action mailed Oct. 23, 2020 in corresponding Taiwanese Patent Application No. 108137625, along with a partial English translation based on a Japanese translation.

Notice of Decision to Grant dated May 8, 2023 in corresponding Korean Patent Application No. 10-2021-7013138.

International Preliminary Report on Patentability and Written Opinion dated May 14, 2021 in corresponding International Application No. PCT/JP2019/041866 with English translation.

First Office Action with Search Report dated Jul. 9, 2024 in corresponding Chinese Patent Application No. 201980072710.6 and a computer generated English translation.

* cited by examiner

F I G. 1
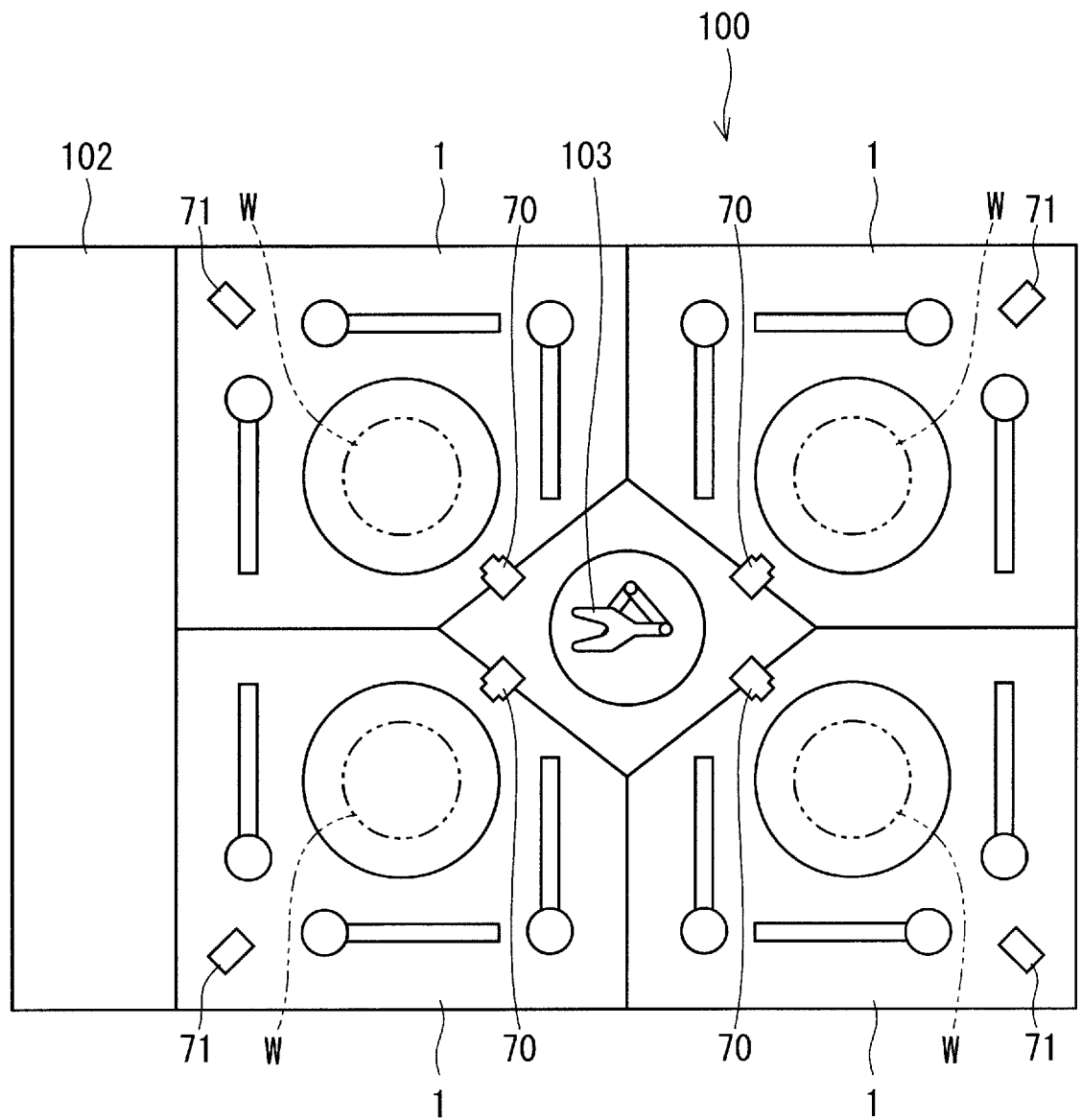

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of International Application No. PCT/JP2019/041866, filed Oct. 25, 2019, which claims priority to Japanese Patent Application No. 2018-207318, filed Nov. 2, 2018, the contents of both of which are incorporated herein by reference. The PCT International Application was published in the Japanese language.

TECHNICAL FIELD

The present invention relates to a substrate processing apparatus and a substrate processing method, and more particularly to a technique for imaging a processing unit for processing a substrate with a camera. Examples of a substrate to be processed include a semiconductor substrate, a substrate for a flat panel display (FPD) such as a liquid crystal display device and an organic electroluminescence (EL) display, a substrate for an optical disk, a substrate for a magnetic disk, a substrate for a magneto-optical disk, a substrate for a photomask, a ceramic substrate, a substrate for a solar battery, and a printed circuit board.

BACKGROUND ART

In a conventional manufacturing process of semiconductor devices and the like, various processing liquids such as pure water, photoresist liquid, and etching liquid are supplied to a substrate to perform substrate processing such as cleaning processing and resist coating processing. As a device for performing liquid processing using these processing liquids, a substrate processing apparatus that discharges each of the processing liquids from a nozzle onto a surface of a substrate while rotating the substrate in a horizontal posture is widely used. This type of substrate processing apparatus processes a plurality of substrates in parallel, and thus may include a plurality of processing units.

In recent years, a substrate processing apparatus is configured such that a processing unit for processing a substrate is imaged by a camera, and the captured image is processed to monitor whether substrate processing is properly performed. For example, Patent Document 1 proposes to monitor discharge of a processing liquid from a nozzle by imaging the nozzle for discharging the processing liquid and processing the image captured thereby.

PRIOR ART DOCUMENT

Patent Document

Patent Document 1: Japanese Patent Application Laid-Open No. 2015-173148

SUMMARY

Problem to be Solved by the Invention

Cameras in parallel communication require providing a dedicated communication line for each of the cameras. In contrast, cameras in serial communication can share a communication line, and thus have an advantage in facilitating addition of the camera. Unfortunately, in the serial communication, cameras are connected to a computer, the communication line is shared and thus requires the cameras and subject areas imaged by the respective cameras to be preliminarily associated with each other to identify which subject area is imaged by which camera.

Conventional association operation has been performed based on manual operation and a visual check of an operator. Specifically, when installing a plurality of cameras, the operator preliminarily records unique identification information (e.g., serial number) on each camera and information on a subject area that is an object for imaging by each camera (e.g., a processing unit number), and inputs the record to the computer. Thus, the conventional association operation causes a heavy operation load on the operator, and thus may cause a human error.

It is an object of the present invention to provide a technique for appropriately associating a plurality of cameras with respective subject areas imaged by the cameras.

Means to Solve the Problem

To solve the above problem, a first aspect is a substrate processing apparatus that processes a substrate and includes at least one processing unit that processes the substrate, first and second cameras that image different subject areas, and an association processing unit that generates association information indicating association between each of the subject areas and each of the first and second cameras by processing an image captured by each of the first and second cameras.

A second aspect is the substrate processing apparatus of the first aspect, wherein a data transfer system for the first and second cameras is serial communication.

A third aspect is the substrate processing apparatus of the first aspect or the second aspect, further including a first illuminator that illuminates a first area of the subject areas, and a second illuminator that illuminates a second area of the subject areas, being different from the first area of the subject areas.

A fourth aspect is the substrate processing apparatus of the third aspect, further including an illumination controller for controlling lighting and extinguishing operations of each of the first and second illuminators, wherein the association processing unit identifies the subject area corresponding to the image in accordance with a luminance value indicated by the image.

A fifth aspect is the substrate processing apparatus of the fourth aspect, wherein the illumination controller performs control of turning on the first illuminator and turning off the second illuminator, and control of turning off the first illuminator and turning on the second illuminator.

A sixth aspect is the substrate processing apparatus according to any one of the third to fifth aspects, wherein illumination patterns for the first and second illuminators are different from each other, and the association processing unit identifies the subject area corresponding to the image in accordance with the illumination patterns.

A seventh aspect is the substrate processing apparatus of the sixth aspect, wherein the association processing unit identifies the subject area corresponding to the image in accordance with luminance value distribution in the image.

An eighth aspect is the substrate processing apparatus of the sixth or seventh aspect, wherein light emitted from the first illuminator and light emitted from the second illuminator are different in color from each other, and the association processing unit identifies the subject area corresponding to the image in accordance with information on color of the image.

A ninth aspect is the substrate processing apparatus according to any one of the first to eighth aspects, further including a storage unit that stores reference information indicating the subject area corresponding to an index object, wherein the processing unit includes the index object, and the association processing unit identifies the subject area corresponding to the image based on a figure of the index object and the reference information.

A tenth aspect is the substrate processing apparatus of the ninth aspect, wherein the processing unit includes a movable part that moves within the subject area, the index object includes the movable part, and the association processing unit identifies the subject area corresponding to the image based on a position of the movable part.

An eleventh aspect is the substrate processing apparatus of the ninth or tenth aspect, wherein the association processing unit identifies the subject area corresponding to the image based on pattern matching.

A twelfth aspect is the substrate processing apparatus according to any one of the first to eleventh aspects, wherein a plurality of the processing units are provided, and the subject areas to be respectively imaged by the first camera and the second camera are set to the processing units different from each other.

A thirteenth aspect is the substrate processing apparatus of the fifth aspect, wherein a plurality of the processing units are provided, the first area of the subject areas is set to a first processing unit and the second area of the subject areas is set to a second processing unit, and the association processing unit associates one of the first and second cameras, having imaged one of the images captured by the respective first and second cameras, the one of images having a larger average luminance value, with one of the first area of the subject areas and the second area of the subject areas, being illuminated.

A fourteenth aspect is the substrate processing apparatus according to any one of the first to thirteenth aspects, wherein the first and second cameras image the subject areas which are different from each other and commonly set to the processing unit.

A fifteenth aspect is the substrate processing apparatus according to any one of the first to fourteenth aspects, wherein at least one of the processing units includes a substrate holding part for horizontally holding the substrate, a rotary motor that rotates the substrate holding part about a rotation axis extending in a vertical direction, a nozzle that discharges a processing liquid toward the substrate held by the substrate holding part, and a nozzle moving unit that moves the nozzle to the subject area imaged by one of the first and second cameras.

A sixteenth aspect is a substrate processing method for processing a substrate, including the steps of: a) processing a substrate in a processing unit, and b) processing images captured by every first and second cameras for subject areas different from each other using an association processing unit to respectively associate the subject areas with the first and second cameras.

A seventeenth aspect is the substrate processing method of the sixteenth aspect, wherein a data transfer system for the first and second cameras is serial communication.

An eighteenth aspect is the substrate processing method of the sixteenth or seventeenth aspect, wherein the step b) includes b-1) capturing images with the first and second cameras while a first illuminator that illuminates a first area of the subject areas is turned on and a second illuminator that illuminates a second area of the subject areas is turned off, b-2) associating one of the first and second cameras, having captured one of the images having a larger average luminance value acquired in the step b-1), with the first area of the subject areas, b-3) capturing images with the first and second cameras while the first illuminator is turned off and the second illuminator is turned on, and b-4) associating the other of the first and second cameras, having captured one of the images having a larger average luminance value acquired in the step b-3), with the second area of the subject areas.

Effects of the Invention

According to the substrate processing apparatus of the first aspect, when images captured by the respective cameras are processed, the subject area corresponding to each of the images is identified. This enables automating a process of associating each subject area with corresponding one of cameras. Thus, a human error due to manual operation or a visual check of an operator can be prevented from occurring, so that each of the cameras can be appropriately associated with each of the subject areas imaged by the respective cameras.

According to the substrate processing apparatus of the second aspect, each camera performs serial communication, and thus can share a communication line. This enables the number of cameras to be easily increased.

According to the substrate processing apparatus of the third aspect, each subject area can be imaged well by respectively illuminating subject areas with the illuminators.

According to the substrate processing apparatus of the fourth aspect, illumination conditions of each subject area can be changed by controlling the operation of turning on and off the illuminators. This enables a luminance value of an image captured by each camera can be changed, so that the subject area corresponding to each image can be easily identified. Thus, the respective cameras can be easily associated with the subject area imaged by the respective cameras.

According to the substrate processing apparatus of the fifth aspect, when one of the first and second illuminators is turned on, the corresponding one of the first and second subject areas is illuminated. Thus, an image of the illuminated subject area, captured by one of the first and second cameras, has a luminance value brighter than an image of the subject area without being illuminated, captured by the other thereof. This enables association for the subject area corresponding to respective cameras, appropriately.

According to the substrate processing apparatus of the sixth aspect, the subject area can be easily identified from the image in accordance with the difference in the illumination pattern.

According to the substrate processing apparatus of the seventh aspect, the subject area can be identified from the image in accordance with a difference in position between a bright portion and a dark portion caused by the difference in the illumination pattern.

According to the substrate processing apparatus of the eighth aspect, the subject area can be easily identified from the image in accordance with the difference in color.

According to the substrate processing apparatus of the ninth aspect, the subject area corresponding to the camera can be identified based on the index object in the image captured by the camera and the reference information.

According to the substrate processing apparatus of the tenth aspect, the subject area corresponding to the image can be identified based on the position of the movable part in the image.

According to the substrate processing apparatus of the eleventh aspect, the subject area corresponding to each image can be identified based on pattern matching.

According to the substrate processing apparatus of the twelfth aspect, the subject area corresponding to the specific processing unit is identified from the image of each of the cameras, so that each of the cameras and the processing unit imaged by the respective cameras can be associated with each other.

According to the substrate processing apparatus of the thirteenth aspect, the subject area corresponding to the specific processing unit is identified from the image of each of the cameras, each of the cameras can be associated with the respective processing units imaged by the respective cameras. Additionally, the illuminators are turned on in order, so that an illuminated image can be easily identified from among images captured by the respective cameras. This enables the cameras and the processing units imaged by the respective cameras to be associated with each other with high accuracy.

According to the substrate processing apparatus of the fourteenth aspect, the subject areas can be respectively associated with the cameras in a common processing unit.

According to the substrate processing apparatus of the fifteenth aspect, the camera imaging the processing unit that performs liquid processing can be appropriately associated with the corresponding subject area.

According to the substrate processing method of the sixteenth aspect, when images captured by the respective cameras are processed, the subject area corresponding to each of the images is identified. This enables automating a process of associating each subject area with corresponding one of cameras. Thus, a human error due to manual operation or a visual check of an operator can be prevented from occurring, so that each of the cameras can be appropriately associated with each of the subject areas imaged by the respective cameras.

According to the substrate processing method of the seventeenth aspect, each camera performs serial communication, and thus can share a communication line. This enables the number of cameras to be easily increased.

According to the substrate processing method of the eighteenth aspect, the subject area corresponding to the specific processing unit is identified from the image of each of the cameras, the cameras can be associated with the respective processing units imaged by the corresponding cameras. Additionally, the first and second illuminators are turned on in order, so that an illuminated image can be easily identified from among images captured by the respective cameras. This enables each of the cameras and the subject areas imaged by the respective cameras to be associated with each other with high accuracy.

BRIEF DESCRIPTION OF DRAWINGS

FIG. 1 is a diagram illustrating an entire structure of a substrate processing apparatus 100 of a first embodiment.

DESCRIPTION OF EMBODIMENTS

Figure 2:
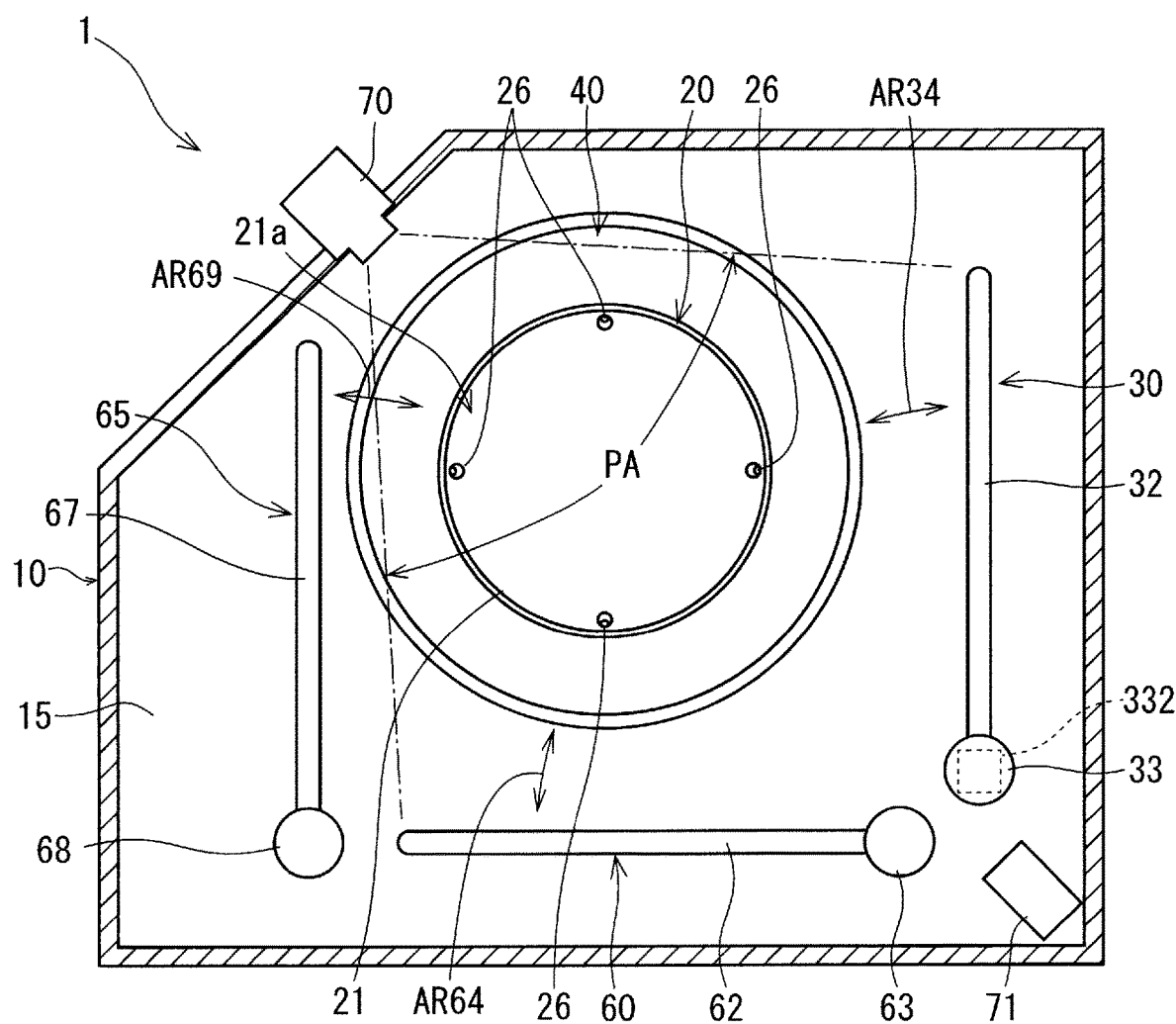
FIG. 2 is schematic plan view of a cleaning processing unit 1 of the first embodiment.

Embodiments of the present invention will be described below with reference to the accompanying drawings. Components described in the embodiments are each only an example, so that the scope of the present invention does not intend to be limited to only the components. The dimensions of components and the number of components may be illustrated in exaggeration or in simplified form, as appropriate, in the drawings, for the sake of easier understanding.

Expressions indicating relative or absolute positional relationships, such as "in one direction", "along one direction", "parallel", "orthogonal", "center", "concentric", and "coaxial", represent not only the positional relationships exactly, but also a state of being displaced relative to an angle or a distance within a tolerance or a range where similar function can be obtained, unless otherwise identified. Expressions indicating equality, such as "same", "equal", and "homogeneous" represent not only quantitatively exactly equal states, but also a state with a difference that is in a tolerance or can provide a similar function, unless otherwise identified. Unless otherwise identified, an expression indicating a shape, such as a "square shape" or a "cylindrical shape", represents not only the shape strictly geometrically, but also a shape having unevenness or a chamfer, for example, within a range where similar effect can be obtained. Expressions, one component is "provided", "equipped", "furnished", or "included", and "have" one component are not exclusive expressions that exclude existence of other components. Unless otherwise identified, an expression, "on something" includes not only two elements in contact with each other but also two elements separated from each other.

1. First Embodiment

FIG. 1 is a diagram illustrating an entire structure of a substrate processing apparatus 100 of a first embodiment. The substrate processing apparatus 100 is a single wafer type processing apparatus that processes a substrate W to be processed one by one. The substrate processing apparatus 100 performs cleaning processing on the substrate W, which is a silicon substrate in the shape of a circular wafer, with a chemical liquid and a rinsing liquid such as pure water, and then performs a drying process. Examples of the chemical liquid include SC1 (ammonia-hydrogen peroxide mixture), SC2 (hydrochloric hydrogen peroxide mixed water liquid), and DHF (dilute hydrogen peroxide liquid). In the following description, the chemical liquid and the rinsing liquid are collectively called a "processing liquid". The substrate processing apparatus 100 may be configured to perform wet processing, instead of the cleaning processing, on a substrate by supplying a coating liquid such as a photoresist liquid for a deposition process, a chemical liquid for removing an unnecessary film, and a chemical liquid for etching to the substrate.

The substrate processing apparatus 100 includes a plurality of cleaning processing units 1, an indexer 102, and a main transfer robot 103. The indexer 102 conveys the substrate W to be processed received from outside the apparatus into the apparatus, and carries out the substrate W having been processed for which the cleaning processing has been completed to the outside of the apparatus. The indexer 102 is equipped with a plurality of carriers (not illustrated) and includes a transfer robot (not illustrated). As the carriers, a front opening unified pod (FOUP) or a standard mechanical interface (SMIF) pod, which stores a substrate W in a closed space, or an open cassette (OC) that exposes the substrate W to the outside air, may be used. The transfer robot transfers a substrate W between each of the carriers and the main transfer robot 103.

The cleaning processing unit 1 performs liquid processing and drying processing on one substrate W. Twelve cleaning processing units 1 are disposed in the substrate processing apparatus 100. Specifically, four towers including three cleaning processing units 1 each stacked vertically are disposed surrounding the main transfer robot 103. FIG. 1 conceptually illustrates one of the cleaning processing units 1 stacked in three stages. The number of cleaning processing units 1 in the substrate processing apparatus 100 is not limited to twelve, and may be changed as appropriate.

The main transfer robot 103 is installed in the center of the four towers in which the cleaning processing units 1 are stacked. The main transfer robot 103 carries substrates W to be processed received from the indexer 102 into the respective cleaning processing units 1. The main transfer robot 103 also carries out the substrates W having been processed from the respective cleaning processing units 1 and delivers them to the indexer 102.

<Cleaning Processing Unit 1>

Although one of the twelve cleaning processing units 1 mounted on the substrate processing apparatus 100 will be described below, the other cleaning processing units 1 are identical in configuration except a difference in a placement relationship among nozzles 30, 60, and 65.

Figure 3:
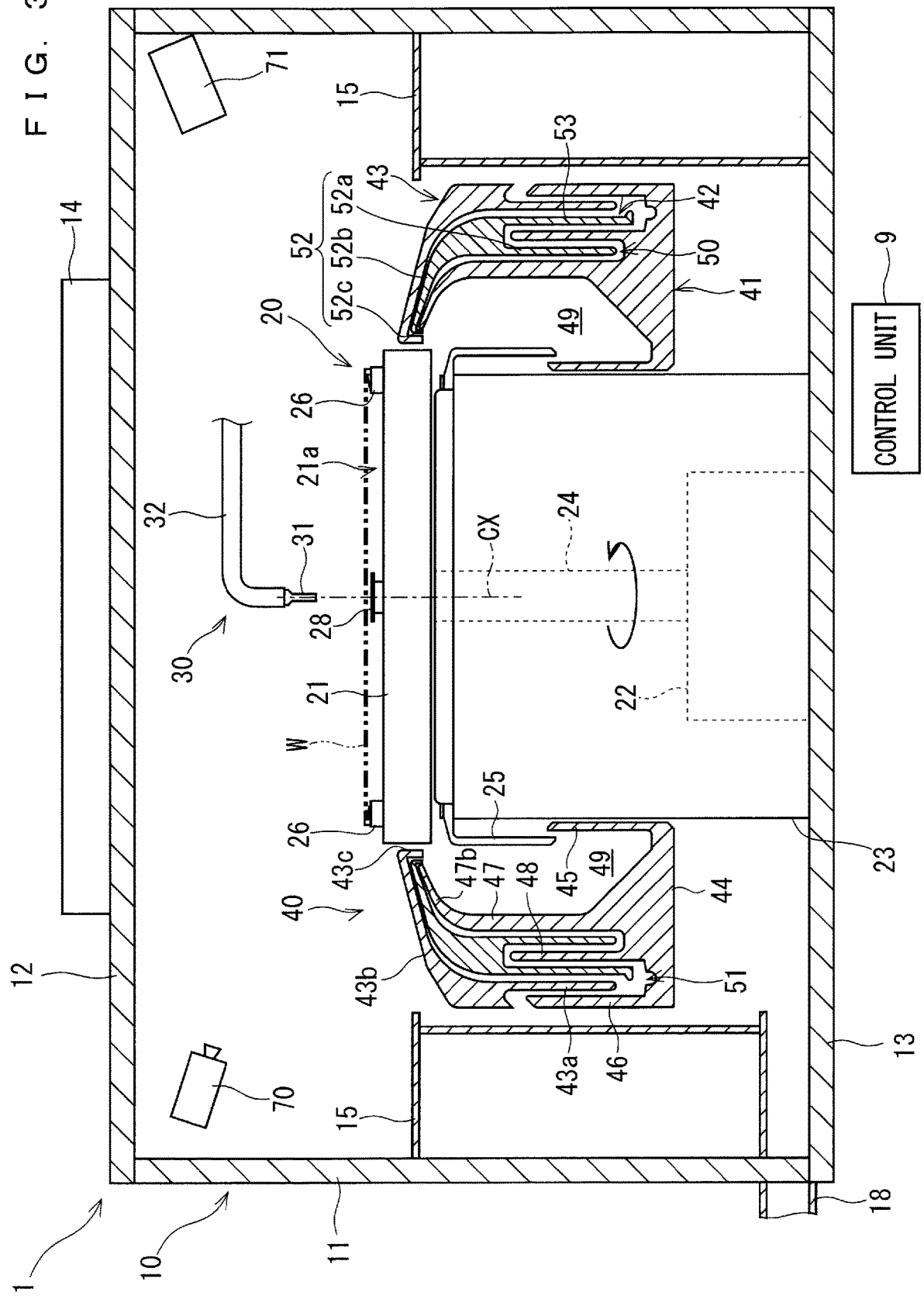
FIG. 3 is a schematic longitudinal sectional view of the cleaning processing unit 1 of the first embodiment.

FIG. 2 is schematic plan view of the cleaning processing unit 1 of the first embodiment. FIG. 3 is a schematic longitudinal sectional view of the cleaning processing unit 1 of the first embodiment. FIG. 2 shows a state where no substrate W is held by a spin chuck 20, and FIG. 3 shows a state where a substrate W is held by the spin chuck 20.

The cleaning processing unit 1 includes, in a chamber 10, the spin chuck 20 that holds the substrate W in a horizontal attitude in which the substrate W has a surface with a normal line along the vertical direction, the three nozzles 30, 60, and 65 for supplying a processing liquid to a top surface of the substrate W held by the spin chuck 20, a processing cup 40 surrounding a periphery of the spin chuck 20, and a camera 70 for imaging a space above the spin chuck 20. The processing cup 40 in the chamber 10 is provided in its periphery with a partition plate 15 for vertically partitioning an inner space of the chamber 10.

The chamber 10 includes a side wall 11 extending vertically and surrounding four sides, a ceiling wall 12 that closes an upper side of the side wall 11, and a floor wall 13 that closes a lower side of the side wall 11. A space surrounded by the side wall 11, the ceiling wall 12, and the floor wall 13 is a processing space for a substrate W. The side wall 11 of the chamber 10 is partially provided with a port for carrying in and out for the main transfer robot 103 to carry in and out the substrate W to and from the chamber 10, and a shutter for opening and closing the port for carrying in and out (both not illustrated).

The ceiling wall 12 of the chamber 10 is provided with a fan filter unit (FFU) 14 attached to further purify air in a clean room where the substrate processing apparatus 100 is installed and supply the air to the processing space in the chamber 10. The FFU14 includes a fan and a filter such as a HEPA filter for taking air into the clean room and feeding the air into the chamber 10. The FFU14 generates a downflow of clean air in the processing space in the chamber 10. To uniformly disperse the clean air supplied from the FFU 14, a punching plate drilled with a large number of blowout holes may be provided directly under the ceiling wall 12.

The spin chuck 20 includes a spin base 21, a spin motor 22, a cover member 23, and a rotating shaft 24. The spin base 21 has the shape of a disk and is fixed in a horizontal attitude to an upper end of the rotating shaft 24 extending in the vertical direction. The spin motor 22 is provided below the spin base 21 and functions as a rotary motor for rotating the rotating shaft 24. The spin motor 22 rotates the spin base 21 in a horizontal plane through the rotating shaft 24. The cover member 23 has a tubular shape surrounding the spin motor 22 and the rotating shaft 24.

The spin base 21 in the shape of a disk has an outer diameter slightly larger than a diameter of a substrate W in a circular shape held by the spin chuck 20. This allows the spin base 21 to have a holding surface 21*a* facing the entire bottom surface of the substrate W to be held.

The holding surface 21*a* of the spin base 21 is provided in its peripheral portion with a plurality (four in the present embodiment) of chuck pins 26 erected. The chuck pins 26 are disposed at equal intervals along a circumference corresponding to an outer diameter of an outer circle of the substrate W in a circular shape. In the present embodiment, the four chuck pins 26 are provided at 90° intervals. Each of the chuck pins 26 is interlocked and driven by a link mechanism (not illustrated) housed in the spin base 21. The spin chuck 20 grips the substrate W by bringing each of the chuck pins 26 into contact with an outer peripheral edge of the substrate W, so that the substrate W is held above the spin base 21, in a horizontal attitude close to the holding surface 21*a* (see FIG. 3). The spin chuck 20 releases the grip of the substrate W by separating each of the chuck pins 26 from the outer peripheral edge of the substrate W. Each of the chuck pins 26 is a substrate holding part that holds the substrate W in a horizontal attitude.

The cover member 23 covering the spin motor 22 has a lower end fixed to the floor wall 13 of the chamber 10, and an upper end located directly below the spin base 21. The cover member 23 is provided in its upper end portion with a collar-shaped member 25 that projects outward from the cover member 23 substantially horizontally and further bends and extends downward. When the spin motor 22 rotates the rotating shaft 24 with the spin chuck 20 holding the substrate W gripped by the plurality of chuck pins 26, the substrate W can be rotated about a rotation axis CX along the vertical direction, passing through the center of the substrate W. The spin motor 22 is driven under control of the control unit 8.

The nozzle 30 is formed with a discharge head 31 attached to a leading end of a nozzle arm 32. The nozzle arm 32 is fixedly connected on its base end side to the nozzle base 33. The nozzle 30 is configured to be rotatable about an axis along the vertical direction using a motor 332 (nozzle moving unit) provided in the nozzle base 33.

When the nozzle base 33 is rotated, the nozzle 30 is moved horizontally in an arc shape, between a position above the spin chuck 20 and a standby position outside the processing cup 40, as shown by an arrow AR34 in FIG. 2. The rotation of the nozzle base 33 causes the nozzle 30 to swing above the holding surface 21*a* of the spin base 21. Specifically, the nozzle 30 is moved above the spin base 21 to a predetermined processing position TP1 extending horizontally. Moving the nozzle 30 to the processing position TP1 is synonymous with moving the discharge head 31 at a leading end of the nozzle 30 to the processing position TP1.

The nozzle 30 is configured to receive supply of a plurality of types of processing liquid (including at least pure water), and the plurality of types of processing liquid can be discharged from the discharge head 31. The nozzle 30 may be provided at its leading end with a plurality of discharge heads 31, and an identical or a different processing liquid may be individually discharged from each of the discharge heads 31. The nozzle 30, specifically, the discharge head 31 stops at the processing position TP1 and discharges the processing liquid. The processing liquid discharged from the nozzle 30 lands on the top surface of the substrate W held by the spin chuck 20.

The cleaning processing unit 1 of the present embodiment is provided with the two nozzles 60 and 65 in addition to the nozzle 30 described above. The nozzles 60 and 65 of the present embodiment each have a configuration identical to or similar to that of the nozzle 30 described above. That is, the nozzle 60 is formed with a discharge head attached to a leading end of a nozzle arm 62, and is moved in an arc shape between a processing position above the spin chuck 20 and a standby position outside the processing cup 40 using a nozzle base 63 connected to a base end side of the nozzle arm 62, as shown by an arrow AR64. The nozzle 65 is formed with a discharge head by attached to a leading end of a nozzle arm 67, and is moved in an arc shape between a processing position above the spin chuck 20 and a standby position outside the processing cup 40 using a nozzle base 68 connected to a base end side of the nozzle arm 67, as shown by an arrow AR69.

The nozzles 60 and 65 are each configured to receive supply of a plurality of types of processing liquid including at least pure water, and to discharge the types of processing liquid to the top surface of the substrate W held by the spin chuck 20 at the processing position. At least one of the nozzles 60 and 65 may be a two-fluid nozzle that injects a mixed fluid of droplets and gas onto a substrate W, the droplets being generated by mixing a cleaning liquid such as pure water and a pressurized gas. The number of nozzles provided in the cleaning processing unit 1 is not limited to three, and may be one or more.

The nozzles 30, 60, and 65 are each not necessarily moved in an arc shape. For example, the nozzle may be linearly moved by providing a straight drive unit.

A bottom surface processing liquid nozzle 28 is provided along the vertical direction passing through the inside of the rotating shaft 24. The bottom surface processing liquid nozzle 28 has an upper end opening formed at a position facing the center of the bottom surface of the substrate W held by the spin chuck 20. The bottom surface processing liquid nozzle 28 is also configured to receive supply of a plurality of types of processing liquid. The processing liquid discharged from the bottom surface processing liquid nozzle 28 lands on the bottom surface of the substrate W held by the spin chuck 20.

The processing cup 40 surrounding the spin chuck 20 includes an inner cup 41, an intermediate cup 42, and an outer cup 43, which can be raised and lowered independently of each other. The inner cup 41 has a shape that surrounds the periphery of the spin chuck 20 and is substantially rotationally symmetric with respect to the rotation axis CX passing through the center of the substrate W held by the spin chuck 20. The inner cup 41 integrally includes a bottom portion 44 in an annular shape in plan view, an inner wall portion 45 in a cylindrical shape rising upward from an inner peripheral edge of the bottom portion 44, an outer wall portion 46 in a cylindrical shape rising upward from an outer peripheral edge of the bottom portion 44, a first guide portion 47 that rises from between the inner wall portion 45 and the outer wall portion 46, and having an upper end portion extending diagonally upward toward a center side (a direction approaching the rotation axis CX of the substrate W held by the spin chuck 20) in a smooth arc shape, and an intermediate wall portion 48 in a cylindrical shape rising upward from between the first guide portion 47 and the outer wall portion 46.

The inner wall portion 45 is housed with an appropriate gap between the cover member 23 and the collar-shaped member 25 in a state where the inner cup 41 is most raised. The intermediate wall portion 48 is housed in a state where the inner cup 41 and the intermediate cup 42 are closest to each other, and an appropriate gap is maintained between a second guide portion 52 and a processing liquid separation wall 53, which are described later, of the intermediate cup 42.

The first guide portion 47 has an upper end portion 47b extending diagonally upward toward the center (the direction approaching the rotation axis CX of the substrate W) in a smooth arc shape. The inner wall portion 45 and the first guide portion 47 define a waste groove 49 therebetween to collect and dispose of a used processing liquid. The first guide portion 47 and the intermediate wall portion 48 define an annular inner recovery groove 50 therebetween to collect and recover the used processing liquid. Additionally, the intermediate wall portion 48 and the outer wall portion 46 define an annular outer recovery groove 51 therebetween to collect and recover a processing liquid different in type from the inner recovery groove 50.

The waste groove 49 is connected to an exhaust fluid mechanism (not illustrated) for forcibly exhausting the inside of the waste groove 49 while discharging the processing liquid collected in the waste groove 49. For example, four exhaust fluid mechanisms are provided at equal intervals along a circumferential direction of the waste groove 49. The inner recovery groove 50 and the outer recovery groove 51 are each connected to a recovery mechanism (not illustrated) to recover a processing liquid collected in the corresponding one of the inner recovery groove 50 and the outer recovery groove 51 to a recovery tank (not illustrated) provided outside the substrate processing apparatus 100. Bottoms of the inner recovery groove 50 and the outer recovery groove 51 are each inclined by a slight angle with respect to the horizontal direction, and the recovery mechanism is connected to the lowest position of each of the bottoms. This allows the processing liquid having flowed into the inner recovery groove 50 and the outer recovery groove 51 to be smoothly recovered.

The intermediate cup 42 has a shape that surrounds the periphery of the spin chuck 20 and is substantially rotationally symmetric with respect to the rotation axis CX passing through the center of the substrate W held by the spin chuck 20. The intermediate cup 42 includes a second guide portion 52 and a processing liquid separation wall 53 in a cylindrical shape connected to the second guide portion 52.

The second guide portion 52 includes, outside the first guide portion 47 of the inner cup 41, with a lower end portion 52a in a cylindrical shape coaxial with a lower end portion of the first guide portion 47, an upper end portion 52b extending diagonally upward toward the center (the direction approaching the rotation axis CX of the substrate W) in a smooth arc shape from an upper end of the lower end portion 52a, and a folded portion 52c formed by folding a leading end portion of the upper end portion 52b downward. The lower end portion 52a is housed in the inner recovery groove 50 while maintaining an appropriate gap between the first guide portion 47 and the intermediate wall portion 48 in a state where the inner cup 41 and the intermediate cup 42 are closest to each other. The upper end portion 52b is provided overlapping the upper end portion 47b of the first guide portion 47 of the inner cup 41 in the vertical direction, and is close to the upper end portion 47b of the first guide portion 47 while maintaining a very minute distance in a state where the inner cup 41 and the intermediate cup 42 are closest to each other. The folded portion 52c overlaps a leading end of the upper end portion 47b of the first guide portion 47 in the horizontal direction in a state where the inner cup 41 and the intermediate cup 42 are closest to each other.

The upper end portion 52b of the second guide portion 52 is formed with wall thickness increasing downward. The processing liquid separation wall 53 has a cylindrical shape provided extending downward from a lower-end outer peripheral edge of the upper end portion 52b. The processing liquid separation wall 53 is housed in the outer recovery groove 51 while maintaining an appropriate gap between the intermediate wall portion 48 and the outer cup 43 in a state where the inner cup 41 and the intermediate cup 42 are closest to each other.

The outer cup 43 has a shape that is substantially rotationally symmetric with respect to the rotation axis CX passing through the center of the substrate W held by the spin chuck 20. The outer cup 43 surrounds the spin chuck 20 outside the second guide portion 52 of the intermediate cup 42. The outer cup 43 has a function as a third guide portion. The outer cup 43 includes a lower end portion 43a in a cylindrical shape coaxial with the lower end portion 52a of the second guide portion 52, an upper end portion 43b extending diagonally upward toward the center (the direction approaching the rotation axis CX of the substrate W) in a smooth arc shape from an upper end of the lower end portion 43a, and a folded portion 43c formed by folding a leading end portion of the upper end portion 43b downward.

The lower end portion 43a is housed in the outer recovery groove 51 while maintaining an appropriate gap between the processing liquid separation wall 53 of the intermediate cup 42 and the outer wall portion 46 of the inner cup 41 in a state where the inner cup 41 and the outer cup 43 are closest to each other. The upper end portion 43b is provided overlapping the second guide portion 52 of the intermediate cup 42 in the vertical direction, and is close to the upper end portion 52b of the second guide portion 52 while maintaining a very minute distance in a state where the intermediate cup 42 and the outer cup 43 are closest to each other. The folded portion 43c overlaps the folded portion 52c of the second guide portion 52 in the horizontal direction in a state where the intermediate cup 42 and the outer cup 43 are closest to each other.

The inner cup 41, the intermediate cup 42, and the outer cup 43 can be raised and lowered independently of each other. That is, each of the inner cup 41, the intermediate cup 42, and the outer cup 43 is individually provided with an elevating mechanism (not illustrated), and thus is independently elevated by the elevating mechanism. As such an elevating mechanism, various known mechanisms such as a ball screw mechanism and an air cylinder can be used.

The partition plate 15 is provided partitioning the inner space of the chamber 10 vertically around the processing cup 40. The partition plate 15 may be a single plate-shaped member surrounding the processing cup 40, or may be formed by combining a plurality of plate-shaped members. The partition plate 15 may be formed with a through-hole or a cutout passing therethrough in its thickness direction. In the present embodiment, the partition plate 15 is formed with through-holes respectively allowing shafts for supporting the nozzle bases 33, 63, and 68 of the nozzles 30, 60, and 65 to pass through the through-holes.

The partition plate 15 has an outer peripheral edge connected to the side wall 11 of the chamber 10. The partition plate 15 has an edge portion surrounding the processing cup 40, the edge portion being formed in a circular shape having a diameter larger than an outer diameter of the outer cup 43. Thus, the partition plate 15 does not hinder raising and lowering of the outer cup 43.

The chamber 10 has a portion in the side wall 11 and near the floor wall 13, being provided with an exhaust duct 18.

The exhaust duct 18 is connected in communication with an exhaust mechanism (not illustrated). Clean air supplied from a fan filter unit 14 and flowing down inside the chamber 10 includes air having passed between the processing cup 40 and the partition plate 15, which is discharged from the exhaust duct 18 to the outside of the apparatus.

Figure 4:
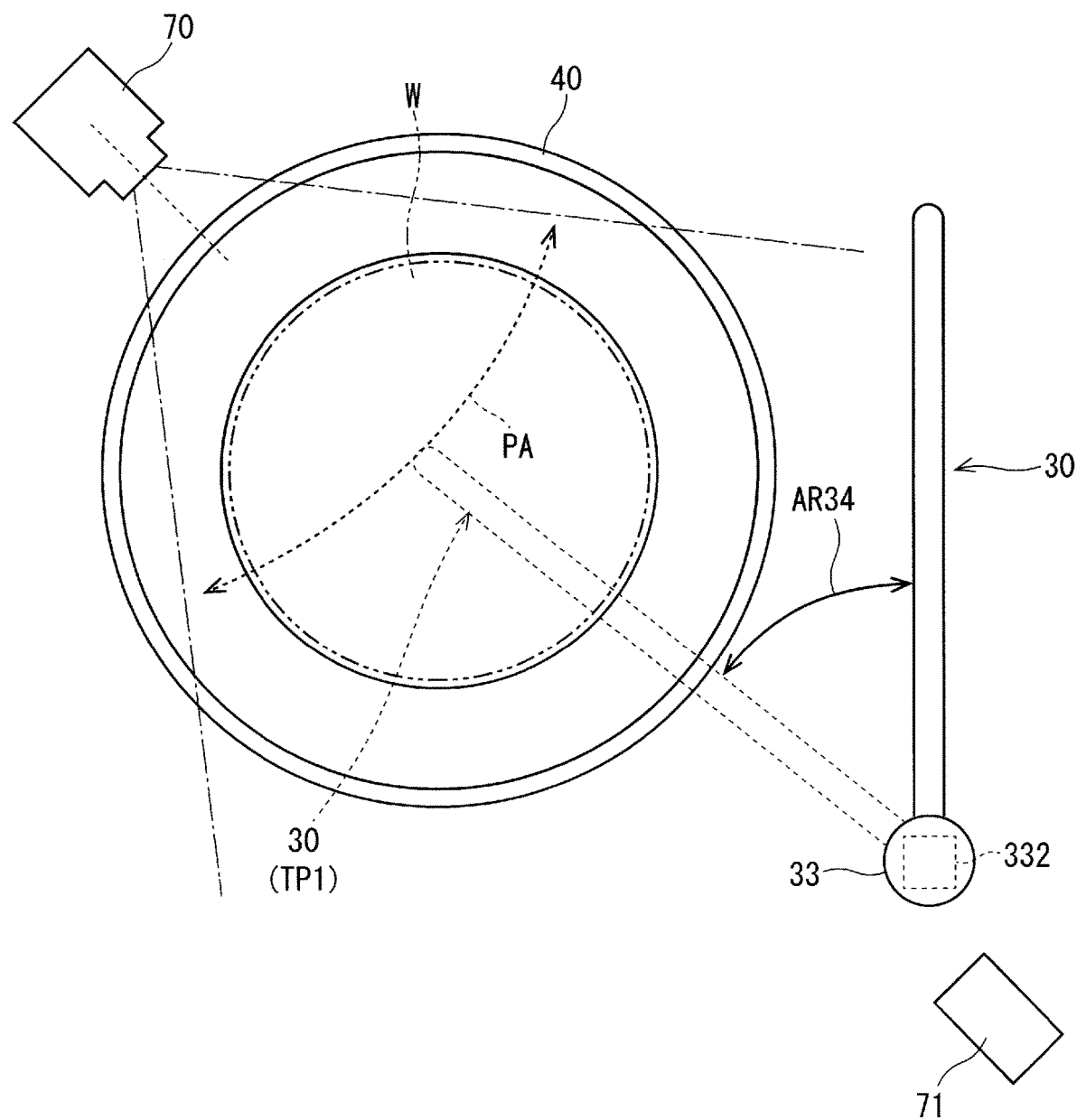
FIG. 4 is a diagram illustrating a positional relationship between a camera 70 and a nozzle 30 being a movable part.

FIG. 4 is a diagram illustrating a positional relationship between the camera 70 and the nozzle 30 being a movable part. The camera 70 is provided vertically above the substrate W in the vertical direction. The camera 70 includes, for example, a CCD that is one of solid-state image sensors, and an optical system including an electronic shutter, a lens, and other components. An imaging direction (i.e., an optical axis direction of an imaging optical system) of the camera 70 is set diagonally downward toward the center of rotation (or its vicinity) of the top surface of the substrate W to image the top surface of the substrate W. A visual field of the camera 70 includes the entire top surface of the substrate W held by the spin chuck 20. For example, the visual field of the camera 70 horizontally includes a range (subject area) surrounded by chain lines in FIG. 2.

The camera 70 is installed with a visual field for imaging thereof including at least the leading end of the nozzle 30 at the processing position TP1, i.e., is installed at a position including the vicinity of the discharge head 31. In the present embodiment, as illustrated in FIG. 4, the camera 70 is installed at a position where the nozzle 30 at the processing position TP1 is imaged from the front and above. This enables the camera 70 to image the subject area PA including the leading end of the nozzle 30 at the processing position TP1. Similarly, when the nozzles 60 and 65 are each at a processing position for processing the substrate W held by the spin chuck 20, the camera 70 images the subject area PA including the respective leading ends. When the camera 70 is installed at the position shown in each of FIGS. 2 and 4, the nozzles 30 and 60 move laterally within the visual field for imaging of the camera 70. This enables the leading end of the respective nozzles 30 and 60 at the respective processing positions to be appropriately imaged. However, the nozzle 65 moves in a depth direction within the visual field of the camera 70, so that movement near its processing position may not be appropriately imaged. In this case, a camera for imaging the nozzle 65 may be provided separately from the camera 70.

Driving of the nozzle base 33 reciprocates the nozzle 30 between the processing position TP1 (the position indicated by a broken line in FIG. 4) above the substrate W held by the spin chuck 20 and a standby position outside the processing cup 40 (the position indicated by a solid line in FIG. 4). The processing position TP1 is a position where the processing liquid is discharged from the nozzle 30 onto the top surface of the substrate W held by the spin chuck 20 to perform cleaning processing. The processing position TP1 is closer to the outer peripheral edge of the substrate W held by the spin chuck 20 than the center thereof. The standby position is a position where discharge of the processing liquid is stopped and the nozzle 30 stands by when the cleaning processing is not performed. The standby position is deviated from above the spin base 21 and is outside the processing cup 40 in a horizontal plane. The standby position may be provided with a standby pod for housing the discharge head 31 of the nozzle 30.

The processing position TP1 may be an arbitrary position such as the center of the substrate W, and further, the processing position TP1 may be deviated from above the substrate W. In the latter case, the processing liquid discharged from the nozzle 30 is preferably scattered from the outside of the substrate W onto the top surface of the substrate W. The nozzle 30 does not necessarily discharge the processing liquid by being stopped at the processing position TP1. For example, the nozzle 30 may be moved within a predetermined processing section extending in the horizontal direction above the substrate W with the processing position TP1 as one end while the processing liquid is discharged from the nozzle 30.

As illustrated in FIG. 3, an illuminator 71 is provided in the chamber 10 at a position above the partition plate 15. The illuminator 71 includes, for example, an LED lamp as a light source. The illuminator 71 supplies the processing space with illumination light required for the camera 70 to image the inside of the chamber 10. When each illuminator 71 illuminate corresponding one of the subject areas PA, cameras 70 can satisfactorily image the subject areas PA, respectively. To match conditions for imaging with the respective cameras 70 among the cleaning processing units 1, the illuminator 71 identical in configuration is provided for each of the cleaning processing units 1.

As illustrated in FIG. 3, in each chamber 10, the camera 70 and the illuminator 71 are provided on a diagonal line of the chamber 10, and thus an imaging direction (lens direction) of the camera 70 faces an illumination direction of the illuminator 71. However, this positional relationship is not indispensable. For example, the imaging direction of the camera 70 and the illumination direction of the illuminator 71 may be set to be identical by disposing the illuminator 71 near the camera 70.

Figure 5:
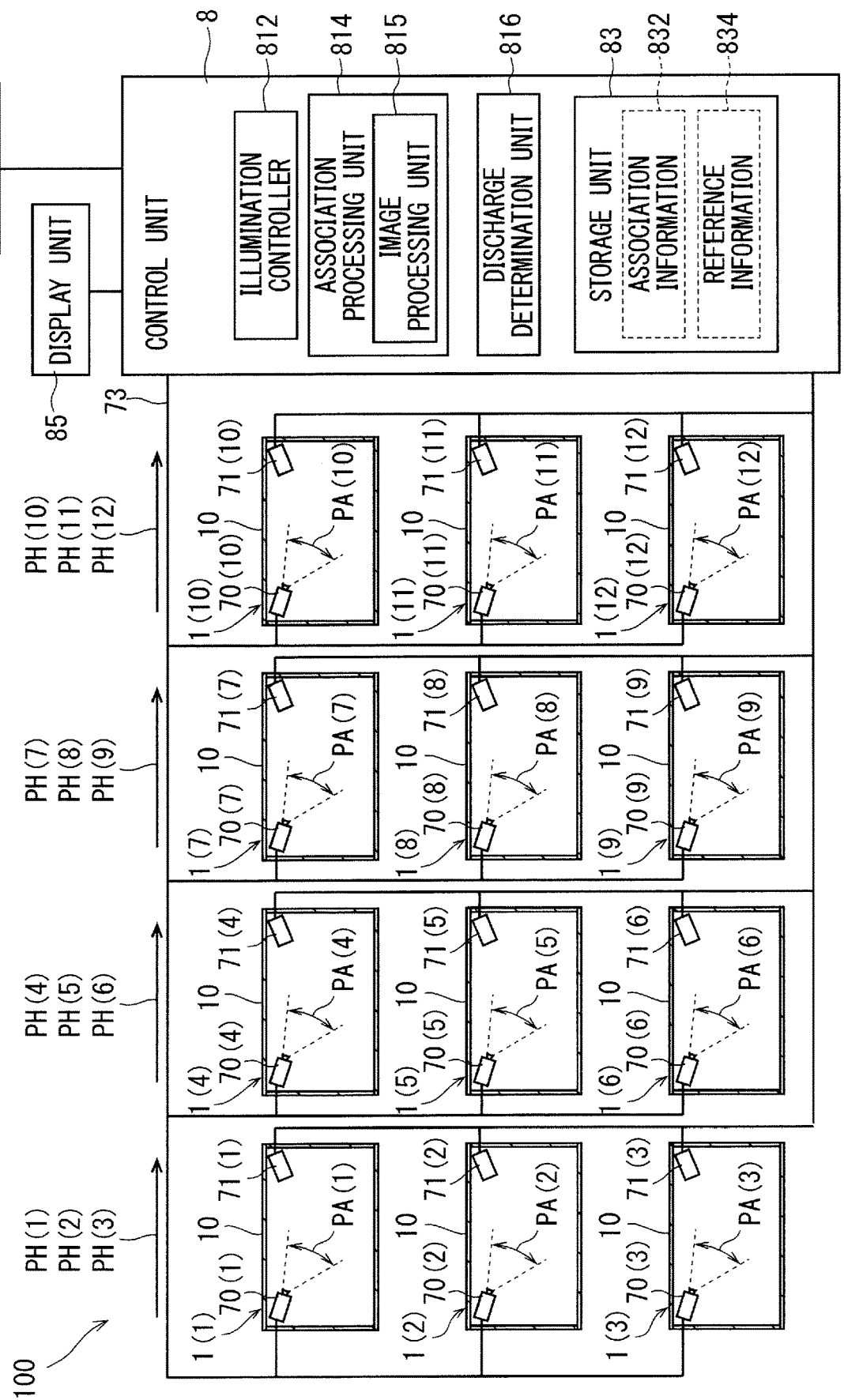
FIG. 5 is a block diagram illustrating a connection relationship between a control unit 8 and each cleaning processing unit 1.

FIG. 5 is a block diagram illustrating a connection relationship between the control unit 8 and each cleaning processing unit 1. The control unit 8 provided in the substrate processing device 100 is similar in hardware configuration to a typical computer. Specifically, the control unit 8 includes a CPU that performs various computation processes, a ROM or a read-only memory for storing a basic program therein, a RAM or a readable and rewritable memory for storing various pieces of information therein, and a magnetic disk for storing control software (program), data, and the like thereon. When the CPU of the control unit 8 executes a predetermined processing program, operation of each element of the substrate processing apparatus 100 is controlled by the control unit 8, and then processing in the substrate processing apparatus 100 proceeds.

FIG. 5 illustrates an illumination controller 812, an association processing unit 814, and a discharge determination unit 816, which are function processing units implemented in the control unit 8 when the CPU of the control unit 8 executes the predetermined processing program.

The illumination controller 812 is connected to each illuminator 71 provided in the substrate processing apparatus 100 in a communicable manner, and controls lighting and extinguishing operations (illumination operation) of each illuminator 71. The illumination controller 812 may independently control the illumination operation of each illuminator 71 such that one of the illuminators 71 is turned on and the others are turned off, for example.

The association processing unit 814 includes an image processing unit 815. The image processing unit 815 processes each image PH captured by the respective cameras 70. Then, the association processing unit 814 identifies each image PH (and thus each camera 70) corresponding to the subject area PA to be identified based on a processing result of the image processing unit 815. The association processing unit 814 can identify the subject area PA based on, for example, a luminance value of each image PH. The association processing unit 814 also can identify the subject area PA by detecting a position of an index object 9 in each image PH, described later.

The association processing unit 814 generates association information 832, in which association between each camera 70 and each of the subject areas PA is recorded, in accordance with the identified results described above. The association information 832 indicates a pair (combination) of unique identification information (e.g., a serial number) on each camera 70 and identification information for identifying each subject area PA (e.g., unique identification information on each cleaning processing unit 1). The association information 832 is appropriately stored in a storage unit 83. The storage unit 83 is an example of an association information storage unit that stores the association information 832.

The discharge determination unit 816 determines whether the processing liquid is discharged from each nozzle 30 in the corresponding one of the cleaning processing units 1 by processing each image PH captured by the respective cameras 70. The technique described in Patent Document 1, for example, may be applied to this determination process. For example, discharge of the processing liquid may be determined such that a determination area is set between the discharge head 31 of the nozzle 30 disposed at the processing position TP1 and the substrate W, and the discharge determination unit 816 performs pattern matching using a reference image in the determination area. When the discharge determination unit 816 determines the discharge of the processing liquid from the nozzle 30 in each cleaning processing unit 1, the cleaning processing unit 1 in which the liquid processing of the substrate W is properly performed, or the cleaning processing unit 1 in which the liquid processing of the substrate W is not performed properly, can be detected.

A nozzle position determination unit for determining a nozzle position may be provided. For example, the determination area is preliminarily set at a position corresponding to the processing position TP1 on the image PH captured by the camera 70, and the nozzle position determination unit may detect a position of the nozzle 30 by performing pattern matching using the reference image in the determination area. When the position of the nozzle 30 in the determination area is detected, a position deviation of the nozzle 30 from the processing position TP1 considered to be the standard can be detected.

The control unit 8 includes a storage unit 83 including the RAM or the magnetic disk described above. The storage unit 83 stores image data captured by each camera 70, and values input by an operator, for example.

The control unit 8 is connected to a display unit 85 and an input unit 87. The display unit 85 displays various kinds of information in response to an image signal from the control unit 8. The display unit 85 displays, for example, each image PH captured by the respective cameras 70. The input unit 87 is composed of input devices such as a keyboard and a mouse, and receives input operation performed by the operator on the control unit 8.

As illustrated in FIG. 5, the substrate processing apparatus 100 is provided with one camera 70 and one illuminator 71 for each of the twelve cleaning processing units 1. That is, the substrate processing apparatus 100 includes twelve cameras 70 and twelve illuminators 71. Each of the predetermined subject areas PA in chambers 10 different from each other is then captured by the respective cameras 70. That is, the subject areas PA of the respective cameras 70 are different from each other. Hereinafter, when each cleaning processing unit 1 is distinguished, it may be referred to as a "cleaning processing unit 1(n)" (n is an integer of one or more and twelve or less). The camera 70 and the illuminator 71 corresponding to each cleaning processing unit 1(n) may be referred to as a "camera 70(n)" and an "illuminator 71(n)" (n is an integer of one or more and twelve or less). The subject area PA of the camera 70(n) may be referred to as a "subject area PA(n)" (n is an integer of one or more and twelve or less). The image PH captured by each camera 70(n) may be referred to as an "image PH(n)" (n is an integer of one or more and twelve or less).

Each camera 70 and the control unit 8 are connected with a serial bus cable 73. A data transfer system between each camera 70 and the control unit 8 is serial communication. Although each of the cameras 70(1) to 70(12) may be connected to the control unit 8 with a common cable, each of them may be connected to the control unit 8 with a dedicated cable.

The serial bus cable 73 is preferably a universal serial bus (USB). When the camera 70 has an interface supporting plug-and-play like the USB, the camera 70 can be used by simply being connected to the control unit 8 being a computer to receive supply of power from the control unit 8. To use a function as a camera, an application program interface (API) provided by a camera manufacturer may be read from a program according to a predetermined procedure. In general, general-purpose application software is also provided, and thus an image can be acquired and stored using the software.

When each camera 70 performs serial communication, a configuration related to data communication (e.g., a communication line and a processing unit that performs synchronization processing) can be simplified compared to parallel communication, and thus the number of cameras can be relatively easily increased.

When each camera 70 performs serial communication, the control unit 8 can grasp the camera 70 from which a received image PH is transmitted based on unique information on the camera 70 included in a packet of the communication. However, based on the transmitted information alone, the control unit 8 cannot uniquely determine which cleaning processing unit 1 the camera 70 images the subject area PA. This requires the substrate processing apparatus 100 to perform an association processing of associating each camera 70 with the subject area PA imaged by the respective cameras 70.

When the association processing unit 814 processes each image PH captured by the respective cameras 70, the subject area PA imaged by each camera 70 is identified. Then, the association processing unit 814 generates the association information 832 indicating the association between each camera 70 and the each subject area PA. Hereinafter, each association processing for generating the association information 832 will be described.

<First Association Processing>

Figure 6:
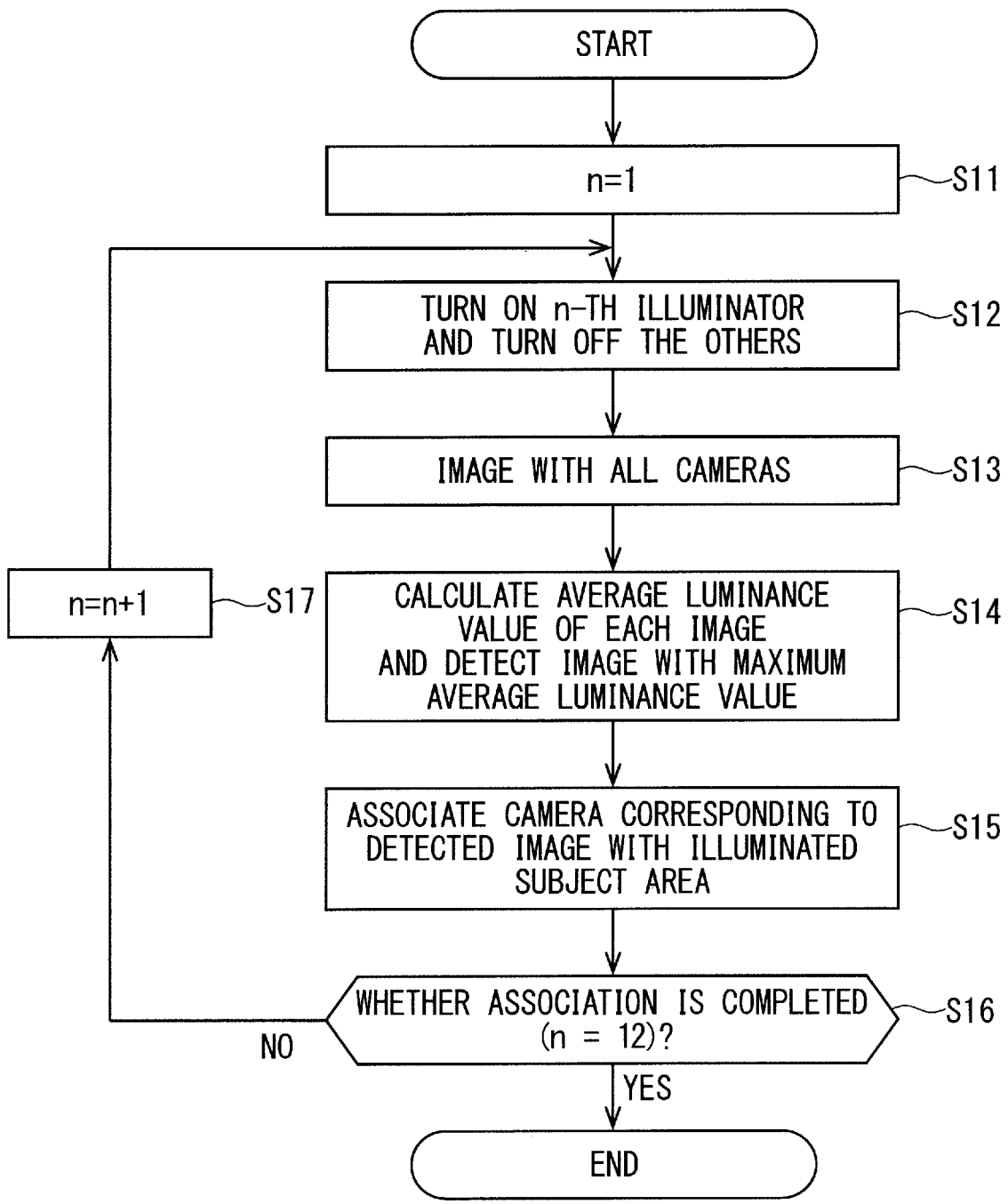
FIG. 6 is a diagram illustrating an example of a flow of a first association processing.

FIG. 6 is a diagram illustrating an example of a flow of first association processing. Unless otherwise specified, the association processing illustrated in FIG. 6 is performed under control of the control unit 8. FIG. 6 illustrates the example in which cameras 70 corresponding to respective subject areas PA(1) to PA(12) are sequentially identified one by one.

In this association processing, first, the first subject area PA(1) is set as the subject area PA to be identified (step S11). Subsequently, the illumination controller 812 turns on the illuminator 71 that illuminates the subject area PA to be identified, and turns off each of the other illuminators 71

(step S12). The subject area PA(1) of the cleaning processing unit 1(1) is first set to be identified in step S11, so that the illumination controller 812 turns on the illuminator 71(1) and turns off the other illuminators 71(2) to 71(12) in step S12.

After step S12, all the cameras 70 perform imaging (step S13). Each camera 70 transmits image data to the control unit 8 with the serial bus cable 73. Each image data transmitted to the control unit 8 includes identification information unique to the respective cameras 70, so that the control unit 8 can determine camera 70 by which the image is captured with reference to the unique information included in the image data. However, at the initial stage, it is unclear which cleaning processing unit 1 has the subject area PA corresponding to the visual field for imaging of each camera 70.

When each image data is transmitted to the control unit 8, the image processing unit 815 of the association processing unit 814 performs image processing of calculating an average luminance value of the image PH indicated by each image data (an average value of luminance values of all pixels). Then, the association processing unit 814 detects the image PH having a maximum average luminance value from among the images PH(step S14).

The image PH of the illuminated subject area PA is relatively brighter than the image PH of the unilluminated subject area PA. In particular, when the chamber 10 is a dark room, the image PH of the subject area PA that is not illuminated has an extremely small luminance value. Thus, comparing average luminance values of the every images PH with each other enables the image PH corresponding to the subject area PA illuminated in step S12 to be easily identified.

For example, in step S12, when the subject area PA(1) is illuminated by the illuminator 71(1), the image PH(1) captured by the camera 70(1) imaging the subject area PA(1) becomes relatively bright, and the images PH(2) to PH(12) for the other subject areas PA(2) to PA(12) become dark. Thus, the camera 70(1) corresponding to the subject area PA(1) can be identified by calculating the average luminance value. In other words, the subject area PA(1) corresponding to the camera 70(1) can be identified.

Besides the average luminance value, the image processing unit 815 may calculate representative values of luminance values, such as a mean luminance value (a mean value of the luminance values of all pixels), a variance of the luminance values, and a standard deviation of the luminance values. Then, the association processing unit 814 may detect the image PH corresponding to the illuminated image based on these representative values. The image processing unit 815 may acquire a differential value of luminance values between a reference image prepared in advance and the image PH to be inspected, and thus detecting an image having the differential value exceeding a predetermined threshold value.

After step S14, the association processing unit 814 associates the camera 70 having captured the image PH extracted in step S13 with the subject area PA illuminated in step S12 (step S15). Specifically, this processing includes processing of generating the association information 832 described with a combination of unique information indicating the camera 70 of the image PH identified in step S13 and identification information indicating the subject area PA illuminated in step S12, and processing of storing the association information 832 in the storage unit 83.

After step S15, the control unit 8 determines whether the association with each subject area PA is completed for all the cameras 70(step S16). Specifically, the control unit 8 determines whether the processing for the subject areas PA up to the twelfth is completed. In step S16, when the subject area PA with no association completed exists (in the case of NO), the association processing unit 814 sets the next subject area PA as an area to be identified (step S17). Then, the processing returns to step S12, and the subsequent processing is repeatedly performed. In step S16, when all the associations are completed (in the case of YES), the control unit 8 completes the association processing between each camera 70 and the corresponding one of the subject areas PA.

As described above, the first association processing enables each subject area PA to be different in illumination pattern (illuminated state or non-illuminated state) by turning on the plurality of illuminators 71 one by one in order. This enables the image PH corresponding to the subject area PA to be identified among the images PH captured by the every cameras 70 to have a brighter luminance value than the other images PH. Thus, the corresponding image PH can be easily detected. This enables the cameras 70 corresponding to the respective subject areas PA to be appropriately identified.

In step S12, only the illuminator 71 corresponding to the subject area PA to be identified may be turned off, and the other illuminators 71 may be turned on. In this case, only the subject area PA to be identified can be darkened. Thus, in step S14, the association processing unit 814 preferably detects the image PH among the images PH captured by the every cameras 70, by the smallest average luminance value as a corresponding one.

According to the substrate processing apparatus 100, the association between each of the cameras 70 and each of the subject areas PA can be automated. This enables suppressing an operation load and an occurrence of a human error caused by an operator performing manual operation and a visual check. Thus, the association can be performed quickly and accurately.

<Second Association Processing>

In the first association processing, different illumination patterns are applied to the respective subject areas PA by turning on one illuminator 71 in order. In contrast, in second association processing, a plurality of illuminators 71 is turned on at the same time, and different illumination patterns are applied to respective subject areas PA. Specifically, when each illuminator 71 has a different duration of lighting, a different illumination pattern is applied to each subject area PA.

When the second association processing is used, each camera 70 may perform continuous imaging. The continuous imaging means that each camera 70 continuously images the corresponding subject area PA at regular intervals. For each subject area PA, data on duration of lighting of the illuminator 71 is stored in advance in the storage unit 83 as reference information 834. The association processing unit 814 preferably detects an image PH that matches the illumination pattern of each subject area PA based on a luminance value indicated by the respective image data obtained by continuous imaging and the reference information 834.

For example, the illuminator 71(1) is turned on for one second for the subject area PA(1), and the illuminator 71(2) is turned on for two seconds for the subject area PA(2). The association processing unit 814 may acquire image data matching each illumination pattern from among image data obtained by the respective cameras 70 based on a luminance value such as an average luminance value. For example, image data from the camera 70(1) corresponding to the illuminator 71(1) in each image includes a bright image frame having an average luminance value exceeding a predetermined threshold value for only one second. Image data from the camera 70(2) corresponding to the illuminator 71(2) includes the bright image frame for only two seconds. In this way, the corresponding camera 70 can also be identified by illuminating the respective subject areas PA with illumination patterns having different lighting times.

The second association processing enables all the subject areas PA to be associated with each of the cameras 70 at once by illuminating all the subject areas PA with different illumination patterns at the same time. Additionally, all the subject areas PA may be divided into a plurality of groups, and the association processing per group may be performed in group order.

When different illumination patterns are used, it is conceivable to change at least one of the duration of lighting, duration of turning off, and the number of times of turning on (number of times of turning off). For example, the respective subject areas PA may be illuminated with illumination patterns different in duration of turning off. In this case, each image data obtained by the respective cameras 70 includes a dark image frame having an average luminance value smaller than a predetermined threshold value for a different time in accordance with the corresponding one of the illumination patterns. Thus, the association processing unit 814 preferably identify cameras 70 corresponding to the respective subject areas PA by acquiring the time of the dark image frame.

<Third Association Processing>

In third association processing, when each illuminator 71 illuminates the corresponding one of the subject areas PA with light different in color, a different illumination pattern is applied to each subject area PA. Each camera 70 may be provided with a color image sensor so that each color can be detected. When each subject area PA is illuminated with light different in color, each image PH obtained by the respective cameras 70 has different color information. Information on the color of the light emitted to each subject area PA is stored in advance in the storage unit 83 as the reference information 834. Then, the association processing unit 814 may identify not only the color information possessed by each image PH by image processing, and with reference to the reference information 834, but also the subject area PA irradiated with the light in color corresponding to the color information.

The third association processing enables all the subject areas PA to be associated with each of the cameras 70 at once by illuminating all the subject areas PA with light different in color at the same time. Additionally, all the subject areas PA may be divided into a plurality of groups, and the association processing per group may be performed in group order.

<Fourth Association Processing>

In fourth association processing, when each illuminator 71 illuminates the respective subject areas PA with a luminance value distribution different among images PH captured by the respective cameras 70, a different illumination pattern is applied to each subject area PA.

Figure 7:
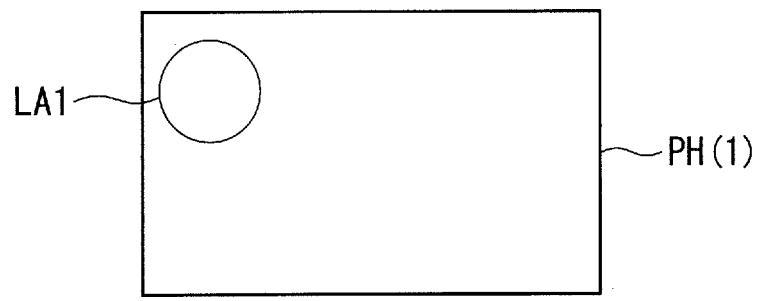
FIG. 7 is a diagram schematically illustrating an image PH(1) captured by a camera 70(1) in a fourth association processing.
Figure 8:
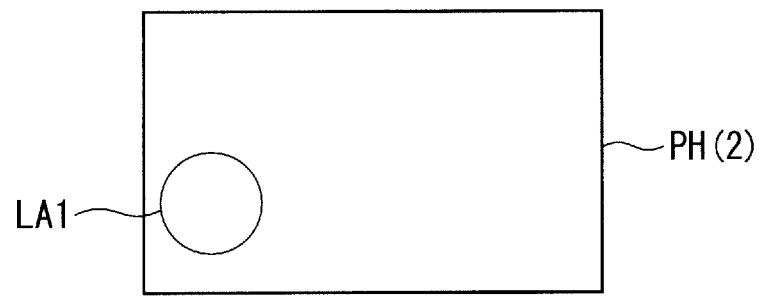
FIG. 8 is a diagram schematically illustrating an image PH(2) captured by a camera 70(2) in the fourth association processing.
Figure 9:
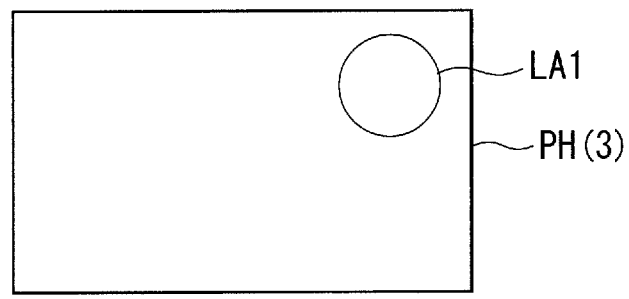
FIG. 9 is a diagram schematically illustrating an image PH(3) captured by a camera 70(3) in the fourth association processing.
Figure 10:
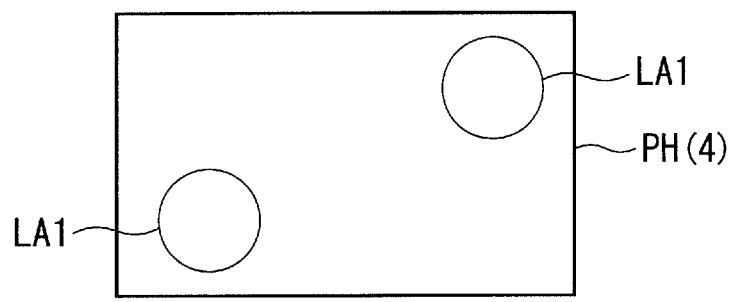
FIG. 10 is a diagram schematically illustrating an image PH(4) captured by a camera 70(4) in the fourth association processing.

FIG. 7 is a diagram schematically illustrating an image PH(1) captured by the camera 70(1) in the fourth association processing. FIG. 8 is a diagram schematically illustrating an image PH(2) captured by the camera 70(2) in the fourth association processing. FIG. 9 is a diagram schematically illustrating an image PH(3) captured by a camera 70(3) in the fourth association processing. FIG. 10 is a diagram schematically illustrating an image PH(4) captured by a camera 70(4) in the fourth association processing. The images PH(1) to PH(4) each contain one or more bright areas LA1. The bright area LA1 is a set of pixels each having a relatively high luminance value, or a luminance value larger than a predetermined threshold value. The bright area LA1 is different in position among images PH(1) to PH(4). For example, the bright area LA1 is located at a position closer to the upper left position in the image PH(1), at a position closer to the lower left in the image PH(2), at a position closer to the upper right in the image PH(3), and at each of a position closer to the lower left and a position closer to the upper right in the image PH(4).

To change a position of the bright area LA1 among the images PH as illustrated in FIGS. 7 to 10, for example, a placement position with respect to the subject area PA or an illumination direction is preferably changed among the illuminators 71. For example, each illuminator 71 may be composed of a plurality of light emitters disposed at different positions in the respective chambers 10. Then, the illumination controller 812 preferably causes each light emitter of the respective illuminators 71 to emit light in a pattern corresponding to a preset luminance value distribution. This enables the pattern of the luminance value distribution to be changed among the images PH captured by the respective cameras 70.

When the fourth association processing is used, data indicating a pattern of the luminance value distribution applied to each subject area PA is stored in advance in the storage unit 83 as the reference information 834. Then, the image processing unit 815 preferably detects the bright area LA1, and the association processing unit 814 preferably identifies the subject area PA that matches the luminance value distribution pattern corresponding to the detected bright area LA1 based on the reference information 834.

The fourth association processing enables a plurality of subject areas PA to be associated with each of the cameras 70 at once. Additionally, all the subject areas PA may be divided into a plurality of groups, and the association processing per group may be performed in order.

<Fifth Association Processing>

In fifth association processing, each camera 70 and each subject areas PA are associated with each other based on the index object 9 disposed at an appropriate position in each subject area PA. The index object 9 is, for example, a member disposed in the chamber 10 of each cleaning processing unit 1 and displaying unique identification information for identifying each subject area PA.

Figure 11:
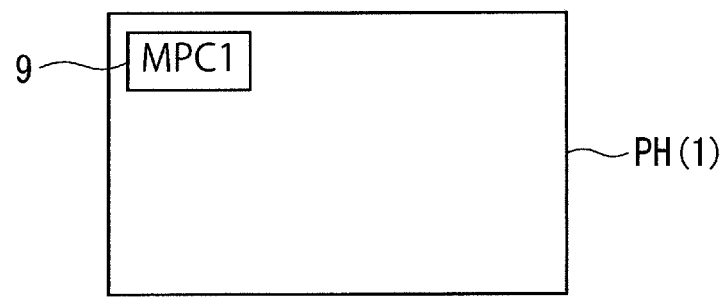
FIG. 11 is a diagram schematically illustrating an image PH(1) captured by the camera 70(1) in a fifth association processing.
Figure 12:
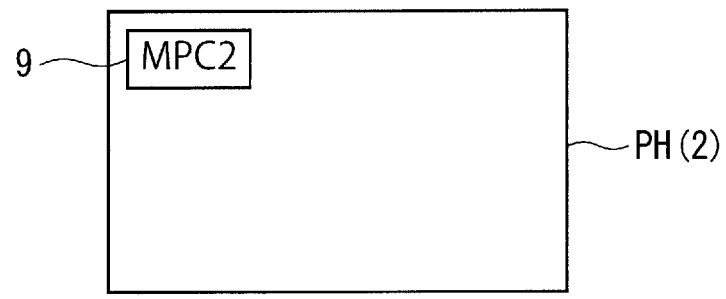
FIG. 12 is a diagram schematically illustrating an image PH(2) captured by the camera 70(2) in the fifth association processing.
Figure 13:
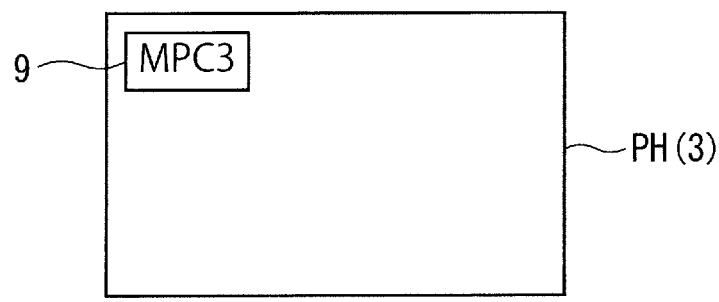
FIG. 13 is a diagram schematically illustrating an image PH(3) captured by the camera 70(3) in the fifth association processing.
Figure 14:
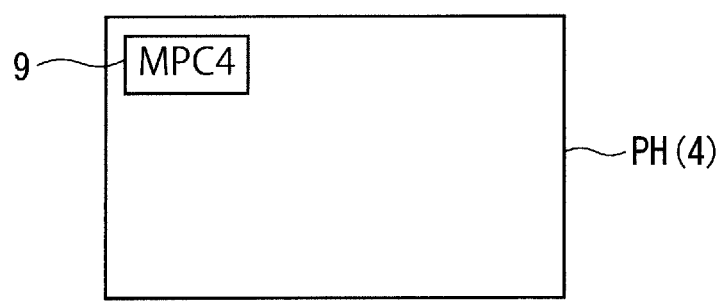
FIG. 14 is a diagram schematically illustrating an image PH(4) captured by the camera 70(4) in the fifth association processing.

FIG. 11 is a diagram schematically illustrating an image PH(1) captured by the camera 70(1) in the fifth association processing. FIG. 12 is a diagram schematically illustrating an image PH(2) captured by the camera 70(2) in the fifth association processing. FIG. 13 is a diagram schematically illustrating an image PH(3) captured by the camera 70(3) in the fifth association processing. FIG. 14 is a diagram schematically illustrating an image PH(4) captured by the camera 70(4) in the fifth association processing. The images PH(1) to PH(4) each contain an image of one index object 9. Each index object 9 displays identification information for identifying the subject area PA where the respective index objects 9 is disposed. The index object 9 illustrated in each of FIGS. 11 to 14 displays the identification information on the cleaning processing unit 1 where the subject area PA is set, and specifically displays characters, such as "MPC1", "MPC2", Each index object 9 may display the identification information on the corresponding subject area PA with a symbol, a shape, or a combination thereof in addition to characters.

When the fifth association processing is used, the identification information displayed by each index object 9 is stored in advance in the storage unit 83 as the reference information 834. The image processing unit 815 processes each image PH captured by the camera 70 to detect the identification information indicated by the figure of the index object 9 included in the image PH. As image processing applied at this time, for example, pattern recognition may be applied. The association processing unit 814 identifies the subject areas PA corresponding to the respective images PH based on detected identification information and the reference information 834. Then, a trained model obtained by machine learning may be applied to the image PH including the figure of the index object 9 to identify the subject area PA corresponding to the image PH.

The fifth association processing enables the subject area PA to be directly identified from the index object 9 included in the image PH obtained by each camera 70. Thus, the respective cameras 70 can be properly associated with the corresponding subject areas PA.

The fifth association processing enables a plurality of subject areas PA to be associated with each of the camera 70 at once. Additionally, all the subject areas PA may be divided into a plurality of groups, and the association processing per group may be performed in group order.

<Sixth Association Processing>

In the fifth association processing, the identification information unique to each subject area PA is displayed as an index object disposed at an appropriate position in the respective subject areas PA. In sixth association processing, the movable part disposed in each cleaning processing unit 1 serves an index object. The movable part can be a member whose position is controlled by the control unit 8.

Figure 15:
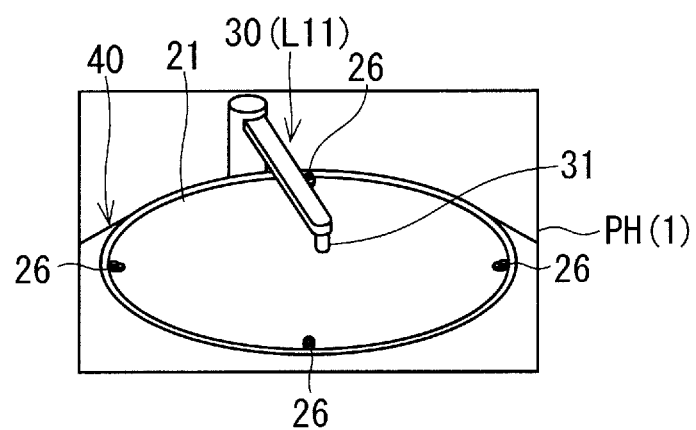
FIG. 15 is a diagram schematically illustrating an image PH(1) captured by the camera 70(1) in a sixth association processing.
Figure 16:
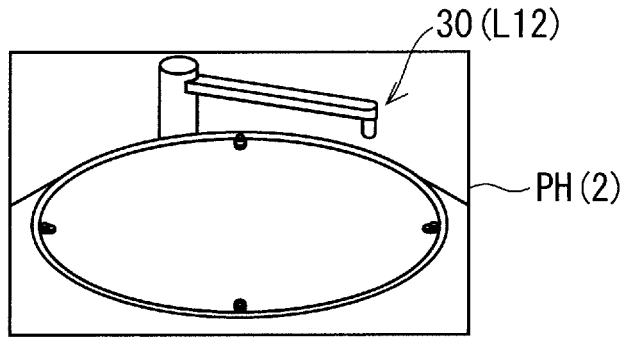
FIG. 16 is a diagram schematically illustrating an image PH(2) captured by the camera 70(2) in the sixth association processing.
Figure 17:
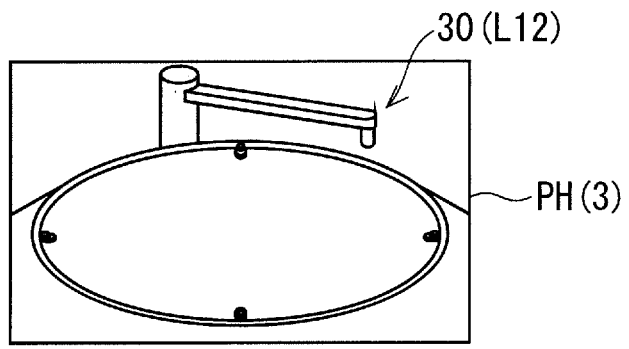
FIG. 17 is a diagram schematically illustrating an image PH(3) captured by the camera 70(3) in the sixth association processing.
Figure 18:
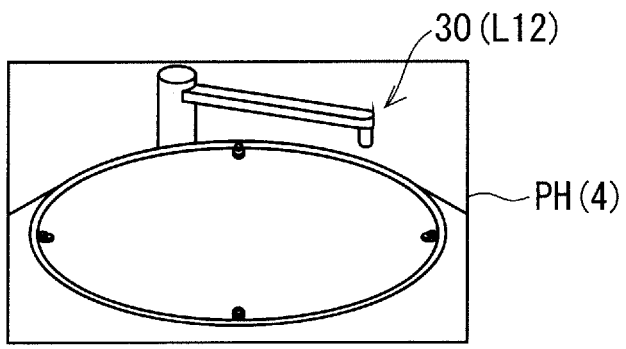
FIG. 18 is a diagram schematically illustrating an image PH(4) captured by the camera 70(4) in the sixth association processing.

FIG. 15 is a diagram schematically illustrating an image PH(1) captured by the camera 70(1) in the sixth association processing. FIG. 16 is a diagram schematically illustrating an image PH(2) captured by the camera 70(2) in the sixth association processing. FIG. 17 is a diagram schematically illustrating an image PH(3) captured by the camera 70(3) in the sixth association processing. FIG. 18 is a diagram schematically illustrating an image PH(4) captured by the camera 70(4) in the sixth association processing. In the examples illustrated in FIGS. 15 to 18, the nozzle 30, which is one of movable parts, serves as an index object, and the subject areas PA include one subject area PA to be identified in which the nozzle 30 (specifically, the discharge head 31) is disposed at a position L11 near the center of the spin base 21, and other subject areas PA in which the nozzle 30 is disposed at a position L12 away from above the spin base 21. This allows the images PH to include only one image PH in which the nozzle 30 is disposed at the position L11 and the other images PH in which the nozzle 30 is disposed at the position L12. In the examples illustrated in FIGS. 15 to 18, the nozzle 30 is disposed at the position L11 in the image PH(1), and the discharge head 31 of the nozzle 30 is located at the position L12 in each of the other images PH(2) to PH(4). Thus, it can be seen that the camera 70 corresponding to the subject area PA to be identified is the camera 70(1). In this way, when the movable part is moved in order for each subject area PA, the corresponding cameras 70 can be identified for all the subject areas PA.

<Seventh Association Processing>

In the sixth association processing, the cameras 70 corresponding to the respective subject areas PA are identified one by one by moving the movable parts one by one. In seventh association processing, each movable part is moved to a relatively different position in the respective subject areas PA. The cameras 70 corresponding to the respective subject areas PA are identified by detecting a position of the movable part in each image PH obtained by the respective cameras 70.

Figure 19:
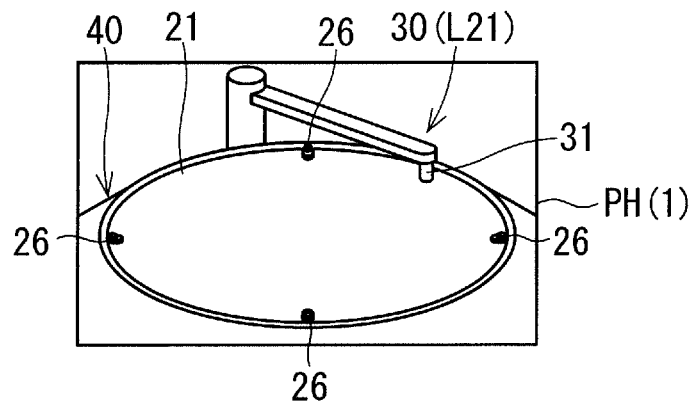
FIG. 19 is a diagram schematically illustrating an image PH(1) captured by the camera 70(1) in a seventh association processing.
Figure 20:
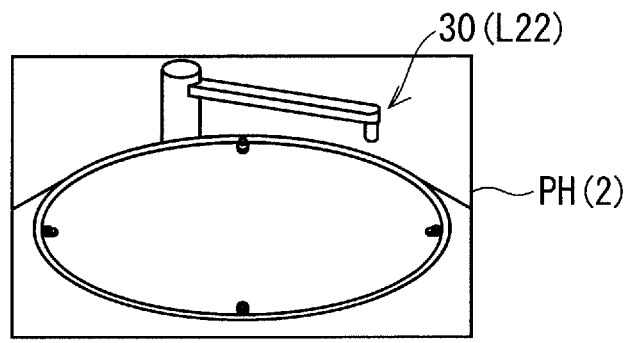
FIG. 20 is a diagram schematically illustrating an image PH(2) captured by the camera 70(2) in the seventh association processing.
Figure 21:
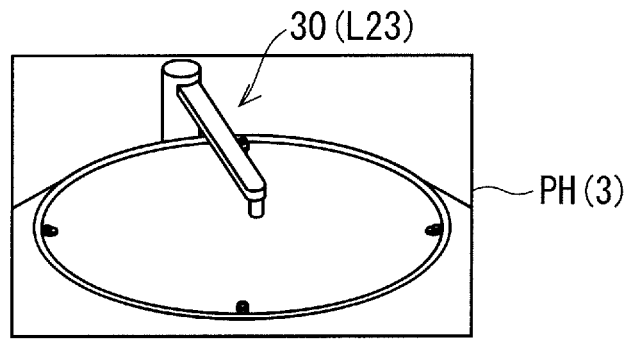
FIG. 21 is a diagram schematically illustrating an image PH(3) captured by the camera 70(3) in the seventh association processing.
Figure 22:
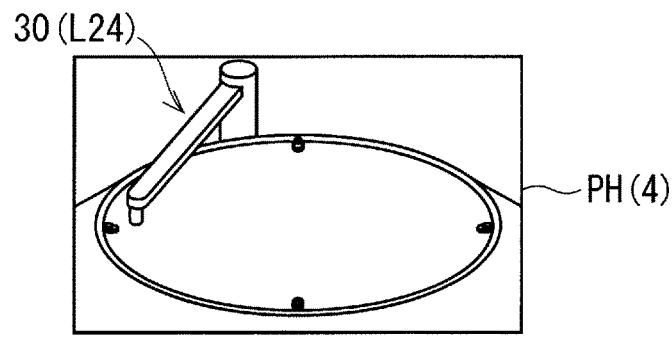
FIG. 22 is a diagram schematically illustrating an image PH(4) captured by the camera 70(4) in the seventh association processing.

FIG. 19 is a diagram schematically illustrating an image PH(1) captured by the camera 70(1) in the seventh association processing. FIG. 20 is a diagram schematically illustrating an image PH(2) captured by the camera 70(2) in the seventh association processing. FIG. 21 is a diagram schematically illustrating an image PH(3) captured by the camera 70(3) in the seventh association processing. FIG. 22 is a diagram schematically illustrating an image PH(4) captured by the camera 70(4) in the seventh association processing. In FIGS. 19 to 22, the nozzle 30, which is a movable parts, is used as an index object, and each nozzle 30 is moved to a relatively different position in the respective subject areas PA. In the examples illustrated in FIGS. 19 to 22, the nozzle 30 is at a relatively different position among the images PH(1) to PH(4). Specifically, the discharge head 31 of the nozzle 30 is located at a position L21 near above a right edge of the spin base 21 in the image PH(1), at a position L22 away from above the spin base 21 in the image PH(2), at a position L23 near the center of the spin base 21 in the image PH(3), and at the position L24 near above a left edge of the spin base 21 in the image PH (4).

When the seventh association processing is used, the position where the movable part is disposed in each subject area PA is stored in advance in the storage unit 83 as the reference information 834. The association processing unit 814 processes each image PH captured by the respective cameras 70 to detect not only the movable part (e.g., the discharge head 31 of the nozzle 30) in each image PH, but also a position of the movable part in each image PH. For detecting the movable part, for example, pattern recognition that performs pattern matching with a reference image prepared in advance can be applied. For acquiring the position of the movable part, a trained model obtained by machine learning may be used. The association processing unit 814 identifies the subject area PA that matches the detected position of the movable part with reference to the reference information 834. This enables each camera 70 and each subject area PA to be appropriately associated with each other.

The seventh association processing enables a plurality of subject areas PA to be associated with each of the cameras 70 at the same time. Additionally, all the subject areas PA may be divided into a plurality of groups, and the association processing per group may be performed in group order.

The movable part serving as an index object is not limited to the nozzle 30. For example, not only the nozzles 60 and 65 but also the chuck pin 26 may be used as an index object. Additionally, not only one movable part but also a plurality of movable parts may be moved. That is, when placement of the plurality of movable parts is changed among the subject areas PA, the movable parts can be changed in position among the images PH captured by the respective cameras 70. Thus, when positions of the plurality of movable parts are detected in each image PH, the corresponding subject area PA can be appropriately identified for each image PH.

2. Second Embodiment

Next, a second embodiment will be described. In the following description, an element having the same function as that already described will be denoted by the same reference sign or a reference sign added with an alphabet letter, and detailed description may be eliminated.

Figure 23:
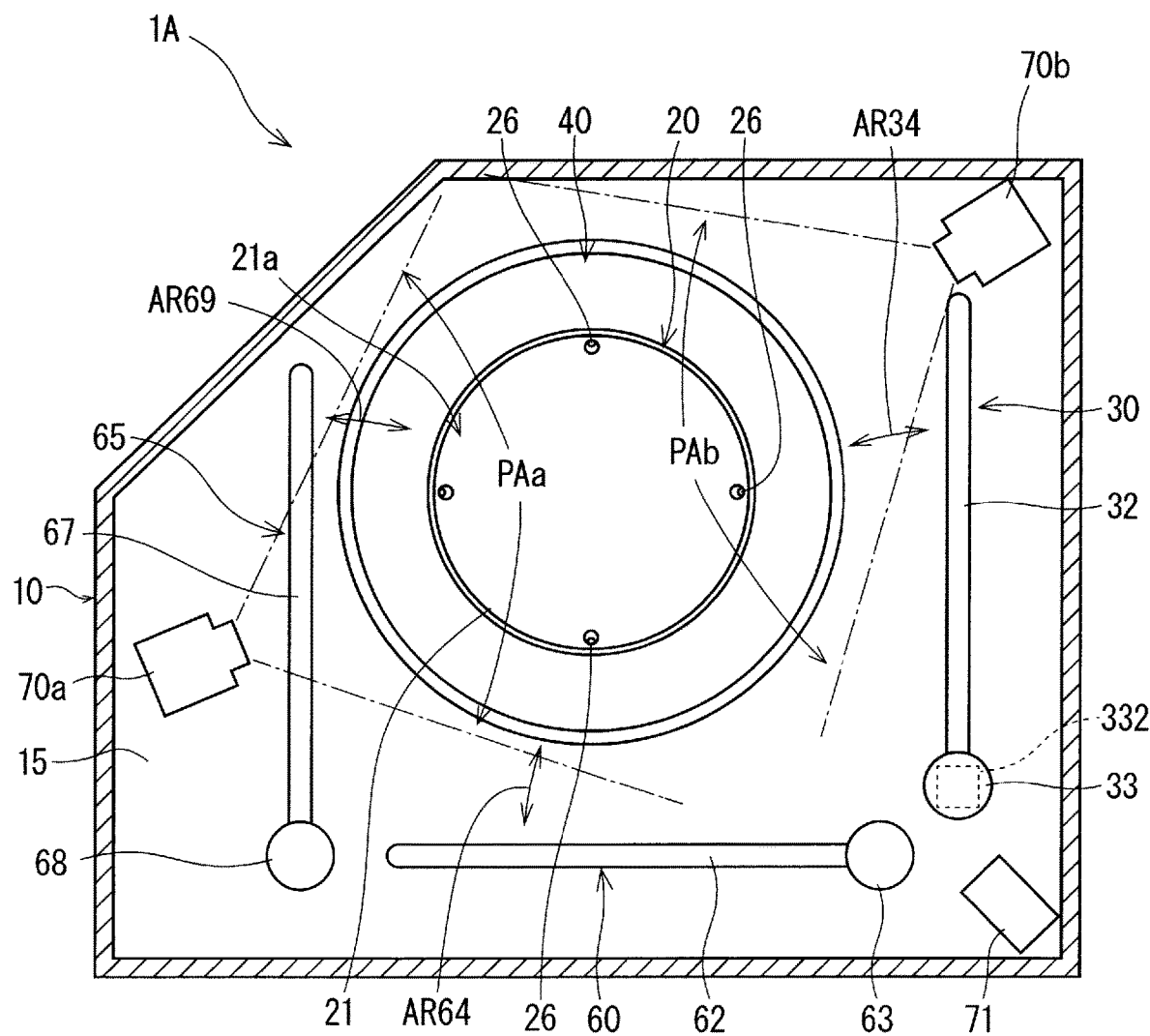
FIG. 23 is schematic plan view of a cleaning processing unit 1A of a second embodiment.

FIG. 23 is schematic plan view of a cleaning processing unit 1A of the second embodiment. The cleaning processing unit 1A is provided with two cameras 70a and 70b. The visual field of the respective cameras 70a and 70b is set at a different position. Thus, the cameras 70a and 70b images different subject areas PAa and PAb, respectively. Although not illustrated, the cameras 70a and 70b transmit image data obtained by imaging to a control unit 8 by serial communication.

FIG. 23 illustrates an example in which the subject area PAa is an object for imaging of the camera 70a, and the subject area PAb is an object for imaging of the camera 70b. The control unit 8 receives image data transmitted by serial communication from each of the cameras 70a and 70b. Although the image data includes unique identification information (e.g., a serial number) of each of the cameras 70a and 70b, the control unit 8 cannot determine whether the serial number corresponds to which of the cameras 70a and 70b, or to which subject area PA. Thus, to monitor each of the subject areas PAa and PAb, each of the cameras 70a and 70b needs to be associated with each of the subject areas PAa and PAb.

The association processing unit 814 generates association information 832 for associating each of the cameras 70a and 70b with each of the subject areas PAa and PAb. The association processing unit 814 identifies the corresponding subject area PAa or PAb based on processing performed by the image processing unit 815 for each image PH captured by the respective cameras 70a and 70b.

The cameras 70a and 70b each image the inside of a chamber 10 of the same cleaning processing unit 1A with a different visual field. Thus, each image PH captured by the respective cameras 70a and 70b has different information. Specifically, comparing two images PH results in not only a case including a figure of an object that is not common to the two images PH, but also a case including a figure of the same object that is at a relatively different position in each of the two images PH. Thus, for example, the association processing unit 814 may detect the image PH corresponding to the subject area PA by detecting an object (or a position of the object) for identification through the image processing unit 815. In this case, as the reference information 834, information on the object to be detected (an image of the figure of the object, positional information) for each subject area PA is preferably stored in advance in the storage unit 83.

Each of the subject areas PAa and PAb may be provided with a unique index object. In this case, the image processing unit 815 preferably detect each of the index objects by image processing such as pattern recognition in the individual image PH captured by the respective cameras 70a and 70b. In accordance with a result of the processing, the association processing unit 814 preferably identify the subject area PAa or PAb corresponding to each image PH.

The index object may be provided in each of the subject areas PAa and PAb, for example, as with the index object 9 illustrated in FIGS. 11 to 14, and identification information unique to each of the subject areas PAa and PAb may be displayed as a character, a shape, a symbol, or a combination thereof. Alternatively, as described in FIGS. 15 to 18, and 19 to 22, a movable part like the nozzle 30 may be used as an index object. For example, the nozzle 30 may be moved to the subject area PAa or PAb.

The substrate processing apparatus 100 may include a plurality of cleaning processing units 1A. In this case, the process described in the first embodiment and the process described in the second embodiment may be applied. Specifically, as described in the above "first association processing", each illuminator 71 of the respective cleaning processing units 1A is turned on one by one. This allows two images PH obtained by the cameras 70a and 70b of the cleaning processing unit 1A illuminated to become relatively bright, so that the cameras 70a and 70b disposed in the cleaning processing unit 1A can be easily identified. Then, when the association processing unit 814 performs the association processing described in the present embodiment, the cameras 70a and 70b can be appropriately associated with the respective subject areas PAa and PAb imaged by the cameras 70a and 70b.

While the present invention is described in detail, the description above is an example in all aspects, and the invention is not limited to the description. Thus, it is perceived that countless variations being not shown by way of example can be assumed without departing from the scope of the present invention. Each configuration described in the above-described embodiments and the modifications can be appropriately combined or eliminated as long as no contradiction arises.

EXPLANATION OF REFERENCE SIGNS

100: substrate processing apparatus
1,1A: cleaning processing unit
10: chamber
20: spin chuck
21: spin base
22: spin motor (rotary motor)
24: rotating shaft
26: chuck pin (movable part)
30,60,65: nozzle (movable part)
31: discharge head
332: motor (nozzle drive unit)
40: processing cup
70,70a,70b: camera
71: illuminator
73: serial bus cable
8: control unit
83: storage unit
85: display unit
87: input unit
812: illumination controller
814: association processing unit
815: image processing unit
832: association information
834: reference information
9: index object
LA1: bright area
PA: subject area
PAa,PAb: subject area
PH: image
W: substrate

The invention claimed is:

1. A substrate processing apparatus that processes a substrate, comprising:
   at least one substrate processor that processes the substrate;
   first and second cameras that image different subject areas;
   a controller that generates association information indicating association between each of said subject areas and each of said first and second cameras by processing an image captured by each of said first and second cameras further comprising:
   a first illuminator that illuminates a first area of said subject areas; and a second illuminator that illuminates a second area of said subject areas, being different from said first area of said subject areas, wherein illumination patterns for said first and second illuminators are different from each other, and said controller identifies said subject area corresponding to said image in accordance with said illumination patterns.

2. The substrate processing apparatus according to claim 1, wherein a data transfer system for said first and second cameras is serial communication.

3. The substrate processing apparatus according to claim 1, wherein said controller controls lighting and extinguishing operations of each of said first and second illuminators, and said controller identifies said subject area corresponding to said image in accordance with a luminance value indicated by said image.

4. The substrate processing apparatus according to claim 3, wherein said controller performs control of turning on said first illuminator and turning off said second illuminator, and control of turning off said first illuminator and turning on said second illuminator.

5. The substrate processing apparatus according to claim 1, wherein said controller identifies said subject area corresponding to said image in accordance with luminance value distribution in said image.

6. The substrate processing apparatus according to claim 1, wherein light emitted from said first illuminator and light emitted from said second illuminator are different in color from each other, and said controller identifies said subject area corresponding to said image in accordance with information on color of said image.

7. The substrate processing apparatus according to claim 1, further comprising:

a storage unit that stores reference information indicating said subject area corresponding to an index object, wherein said processing unit includes said index object, and said association processing unit identifies said subject area corresponding to said image based on a figure of said index object and said reference information.

8. The substrate processing apparatus according to claim 7, wherein said processing unit includes a movable part that moves within said subject area, said index object includes said movable part, and said association processing unit identifies said subject area corresponding to said image based on a position of said movable part.

9. The substrate processing apparatus according to claim 7, wherein said association processing unit identifies said subject area corresponding to said image based on pattern matching.

10. The substrate processing apparatus according to claim 1, wherein a plurality of said processing units are provided, and said subject areas to be respectively imaged by said first and second cameras are set to said processing units different from each other.

11. The substrate processing apparatus according to claim 4, wherein a plurality of said substrate processors are provided, said first area of said subject areas is set to a first processor of said substrate processors and the second area of said subject areas is set to a second processor of said substrate processors, and said controller associates one of said first and second cameras, having imaged one of said images captured by said respective first and second cameras, said one of said images having a larger average luminance value, with one of said first area of said subject areas and said second area of said subject areas, being illuminated.

12. The substrate processing apparatus according to claim 1, wherein said first and second cameras image said subject areas different from each other and commonly set to said processing unit.

13. The substrate processing apparatus according to claim 1, wherein at least one of said processing units includes a substrate holding part for horizontally holding said substrate, a rotary motor that rotates said substrate holding part about a rotation axis extending in a vertical direction, a nozzle that discharges a processing liquid toward said substrate held by said substrate holding part, and a nozzle moving unit that moves said nozzle to the subject area imaged by one of said first and second cameras.

14. A substrate processing method for processing a substrate, comprising the steps of:

a) processing a substrate in a substrate processor, and b) processing images captured by every first and second cameras for subject areas different from each other using a controller to respectively associate said subject areas with said first and second cameras, wherein the step b) includes b-1) capturing images with said first and second cameras while a first illuminator that illuminates a first area of said subject areas is turned on and a second illuminator that illuminates a second area of said subject areas is turned off, b-2) associating one of said first and second cameras, having captured one of said images having a larger average luminance value acquired in said step b-1), with said first area of said subject areas, b-3) capturing images with said first and second cameras while said first illuminator is turned off and said second illuminator is turned on, and b-4) associating the other of said first and second cameras, having captured one of said images having a larger average luminance value acquired in said step b-3), with said second area of said subject areas.

15. The substrate processing method according to claim 14, wherein a data transfer system for said first and second cameras is serial communication.

* * * * *